US011502128B2

(12) United States Patent
Wu et al.

(10) Patent No.: US 11,502,128 B2
(45) Date of Patent: Nov. 15, 2022

(54) MEMORY DEVICE AND METHOD OF FORMING THE SAME

(71) Applicant: Taiwan Semiconductor Manufacturing Co., Ltd., Hsin-Chu (TW)

(72) Inventors: Chao-I Wu, Zhubei (TW); Yu-Ming Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 10 days.

(21) Appl. No.: 17/123,925

(22) Filed: Dec. 16, 2020

(65) Prior Publication Data

US 2021/0399052 A1 Dec. 23, 2021

Related U.S. Application Data

(60) Provisional application No. 63/040,778, filed on Jun. 18, 2020.

(51) Int. Cl.
*H01L 27/24* (2006.01)
*H01L 45/00* (2006.01)
(Continued)

(52) U.S. Cl.
CPC ............ *H01L 27/2454* (2013.01); *G11C 7/18* (2013.01); *G11C 8/14* (2013.01); *H01L 23/5226* (2013.01); *H01L 29/78391* (2014.09); *H01L 45/124* (2013.01); *H01L 45/1206* (2013.01); *H01L 45/1666* (2013.01)

(58) Field of Classification Search
CPC ............. H01L 27/2454; H01L 23/5226; H01L 29/78391; H01L 45/1206; H01L 45/124; H01L 45/1666; H01L 45/06; H01L 45/08; H01L 45/1226; H01L 45/143; H01L 45/144; H01L 45/146; H01L 27/2463;
(Continued)

(56) References Cited

U.S. PATENT DOCUMENTS

2005/0184337 A1 8/2005 Forbes
2006/0113587 A1 6/2006 Thies et al.
(Continued)

FOREIGN PATENT DOCUMENTS

CN 108962905 A 12/2018
CN 111146237 A 5/2020

*Primary Examiner* — David Vu
(74) *Attorney, Agent, or Firm* — Eschweiler & Potashnik, LLC

(57) ABSTRACT

A memory device and method of forming the same are provided. The memory device includes a first memory cell disposed over a substrate. The first memory cell includes a transistor and a data storage structure coupled to the transistor. The transistor includes a gate pillar structure, a channel layer laterally wrapping around the gate pillar structure, a source electrode surrounding the channel layer, and a drain electrode surrounding the channel layer. The drain electrode is separated from the source electrode a dielectric layer therebetween. The data storage structure includes a data storage layer surrounding the channel layer and sandwiched between a first electrode and a second electrode. The drain electrode of the transistor and the first electrode of the data storage structure share a common conductive layer.

20 Claims, 24 Drawing Sheets

(51) Int. Cl.

| | |
|---|---|
| ***H01L 29/78*** | (2006.01) |
| ***H01L 23/522*** | (2006.01) |
| ***G11C 7/18*** | (2006.01) |
| ***G11C 8/14*** | (2006.01) |

(58) Field of Classification Search

CPC ........... H01L 27/2481; H01L 27/10805; H01L 27/11597; H01L 45/1683; H01L 27/11585

See application file for complete search history.

(56) References Cited

U.S. PATENT DOCUMENTS

| | | | |
|---|---|---|---|
| 2012/0161094 | A1 | 6/2012 | Huo et al. |
| 2015/0123189 | A1* | 5/2015 | Sun .................. H01L 27/11556 438/258 |
| 2017/0084627 | A1 | 3/2017 | Lee |
| 2017/0263683 | A1 | 9/2017 | Ramaswamy et al. |
| 2019/0006376 | A1 | 1/2019 | Ramaswamy |
| 2019/0035921 | A1 | 1/2019 | Huang et al. |
| 2019/0214396 | A1 | 7/2019 | Wang et al. |
| 2019/0244933 | A1 | 8/2019 | Or-Bach et al. |
| 2019/0267428 | A1 | 8/2019 | Wu |
| 2019/0296079 | A1 | 9/2019 | Murakami et al. |
| 2020/0044095 | A1 | 2/2020 | Wang et al. |

* cited by examiner

MEMORY DEVICE AND METHOD OF FORMING THE SAME

REFERENCE TO RELATED APPLICATION

This application claims the benefit of U.S. Provisional Application No. 63/040,778, filed on Jun. 18, 2020, the contents of which are hereby incorporated by reference in their entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 17A is a cross-sectional view taken along a line I-I' of FIG. 17B, and FIG. 17B is a plan view taken along a line B-B' of FIG. 17A.

DETAILED DESCRIPTION

Figure 1:
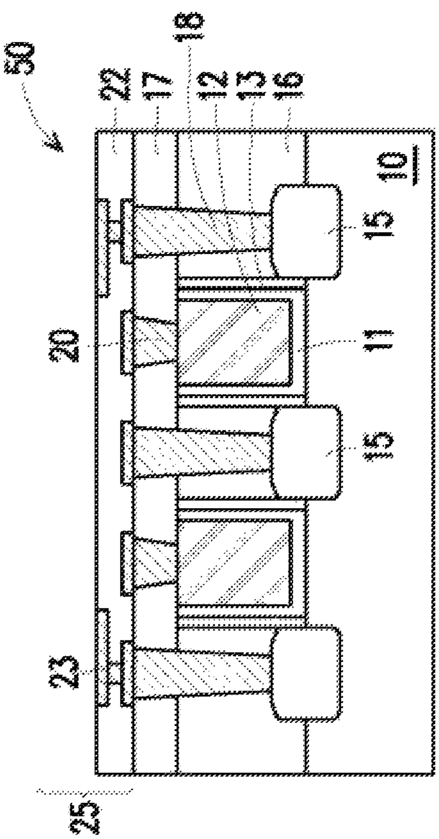
FIGS. 1-3, 4A, 4B, 5A, 5B, 6, 7A, 7B, 8A-8C, 9A-9D, 10A-10D, 11A-11D, 12A-12D, and 13A-13E are various views illustrating intermediate stages in a method of forming a memory device according to some embodiments of the disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-3, 4A, 4B, 5A, 5B, 6, 7A, 7B, 8A-8C, 9A-9D, 10A-10D, 11A-11D, 12A-12D, and 13A-13E are various views illustrating intermediate stages in a method of forming a memory device according to some embodiments of the disclosure.

Referring to FIG. 1, a substrate 10 is provided. The substrate 10 may be a semiconductor substrate, such as a bulk semiconductor substrate, a semiconductor-on-insulator (SOI) substrate, or the like, which may be doped (e.g., with a p-type or an n-type dopant) or undoped. The substrate 10 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 10 may include: silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. In some embodiments, active devices (e.g., transistors, diodes, or the like) and/or passive devices (e.g., capacitors, resistors, or the like) may be formed on and/or in the substrate 10.

FIG. 1 further illustrates circuits that may be formed over the substrate 10. The circuits include transistors on the substrate 10. The transistors may include gate dielectric layers 11 over top surfaces of the substrate 10 and gate electrodes 12 over the gate dielectric layers 11. Gate spacers 13 are formed on sidewalls of the gate dielectric layer 11 and the gate electrode 12. Source/drain regions 15 are disposed in the substrate 10 and on opposite sides of the gate structure including the gate dielectric layer 11, the gate electrode 12 and the gate spacers 13. The transistors may include fin field effect transistors (FinFETs), nanostructure (e.g., nanosheet, nanowire, gate-all-around, or the like) FETS (nano-FETs), planar FETs, the like, or combinations thereof.

A dielectric layer 16 is disposed on the substrate 10 and laterally aside the gate structures of the transistors, and a dielectric layer 17 is disposed on the dielectric layer 16 and the gate structures. The dielectric layer 16 may also be referred to as a first interlayer dielectric (ILD) layer, and the dielectric layer 17 may also be referred to as a second ILD layer. Source/drain contacts 18 penetrate through the dielectric layers 17 and 16 to electrically couple to the source/drain regions 15. Gate contacts 20 penetrate through the dielectric layer 17 to electrically couple to the gate electrodes 12. An interconnect structure 25 is disposed over the dielectric layer 17, the source/drain contacts 18, and the gate contacts 20. The interconnect structure 25 includes one or more stacked dielectric layers 22 and conductive features (or referred to as interconnect layers) 23 formed in the one or more dielectric layers 22, for example. The conductive features 23 may include multiple layers of conductive lines and conductive vias interconnected with each other. The interconnect structure 25 may be electrically connected to the gate contacts 20 and the source/drain contacts 18 of the transistors to form functional circuits, such as a logic circuit. In some embodiments, the functional circuits may include logic circuits, memory circuits, sense amplifiers, controllers, input/output circuits, image sensor circuits, the like, or combinations thereof. Although FIG. 1 discusses transistors formed over the substrate 10, other active devices (e.g., diodes or the like) and/or passive devices (e.g., capacitors, resistors, or the like) may also be formed as part of the functional circuits.

FIG. 2 to FIGS. 13A-13E are various views illustrating intermediate stages in a method of forming a memory array over the transistors of the structure 50 shown in FIG. 1. It is noted that, the components included in the structure 50 are not specifically shown in FIG. 2 and following figures, for the sake of brevity.

Figure 2:
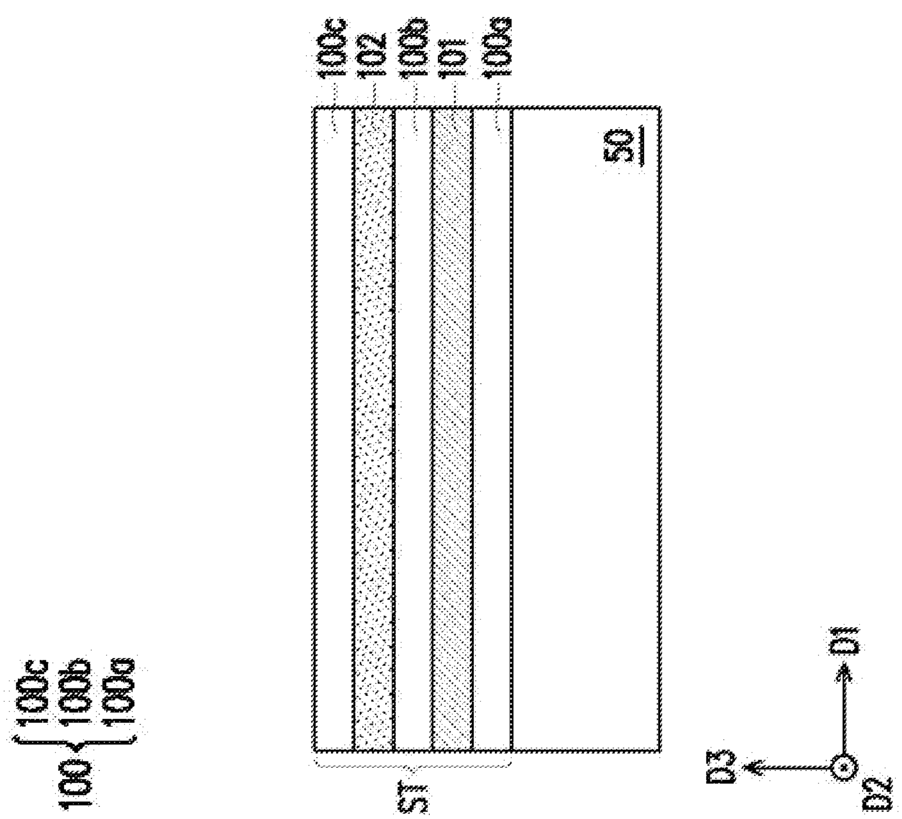

Referring to FIG. 1 and FIG. 2, a stack structure ST including multiple layers is formed on the structure 50 of FIG. 1. In some embodiments, the stack structure ST may be disposed in the intermediate tiers of the interconnection structure 25 over the transistors. In some alternative embodiments, the stack structure ST may be formed over the interconnection structure 25, such as above all the interconnect layers of the interconnection structure 25.

Referring to FIG. 2, in some embodiments, the stack structure ST includes a dielectric layer 100*a*, a conductive layer 101, a dielectric layer 100*b*, a sacrificial layer 102, and a dielectric layer 100*c* sequentially stacked on the structure 50. The dielectric layers 100*a*-100*c* may be collectively referred to as dielectric layers 100. In some embodiments, the dielectric layers 100 include suitable dielectric materials, such as silicon oxide, silicon nitride, silicon oxynitride, combinations thereof, or the like. The sacrificial layer 102 may be patterned and replaced in subsequent steps to define conductive features (e.g., source lines). The sacrificial layer 102 may include a dielectric material, such as silicon oxide, silicon nitride, silicon oxynitride, combinations thereof, or the like. In the embodiments, the sacrificial layer 102 and the dielectric layers 100 are formed of different materials. For example, the dielectric layers 100 include silicon oxide, while the sacrificial layer 102 includes silicon nitride. The conductive layer 101 may include metal, metal nitride or metal alloy, such as copper, titanium, titanium nitride, tantalum, tantalum nitride, tungsten, ruthenium, aluminum, alloys thereof, combinations thereof, or the like. The dielectric layers 100, the conductive layer 101 and the sacrificial layer 102 may be each formed using, for example, chemical vapor deposition (CVD), atomic layer deposition (ALD), physical vapor deposition (PVD), plasma enhanced CVD (PECVD), or the like.

Figure 3:
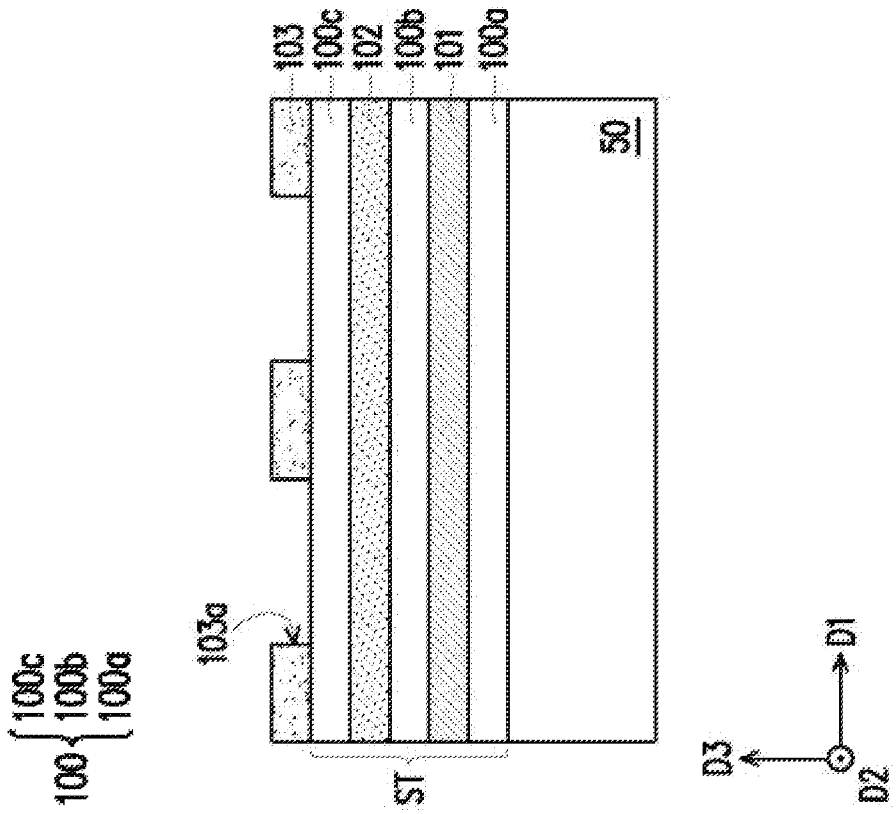
Figure 4B:
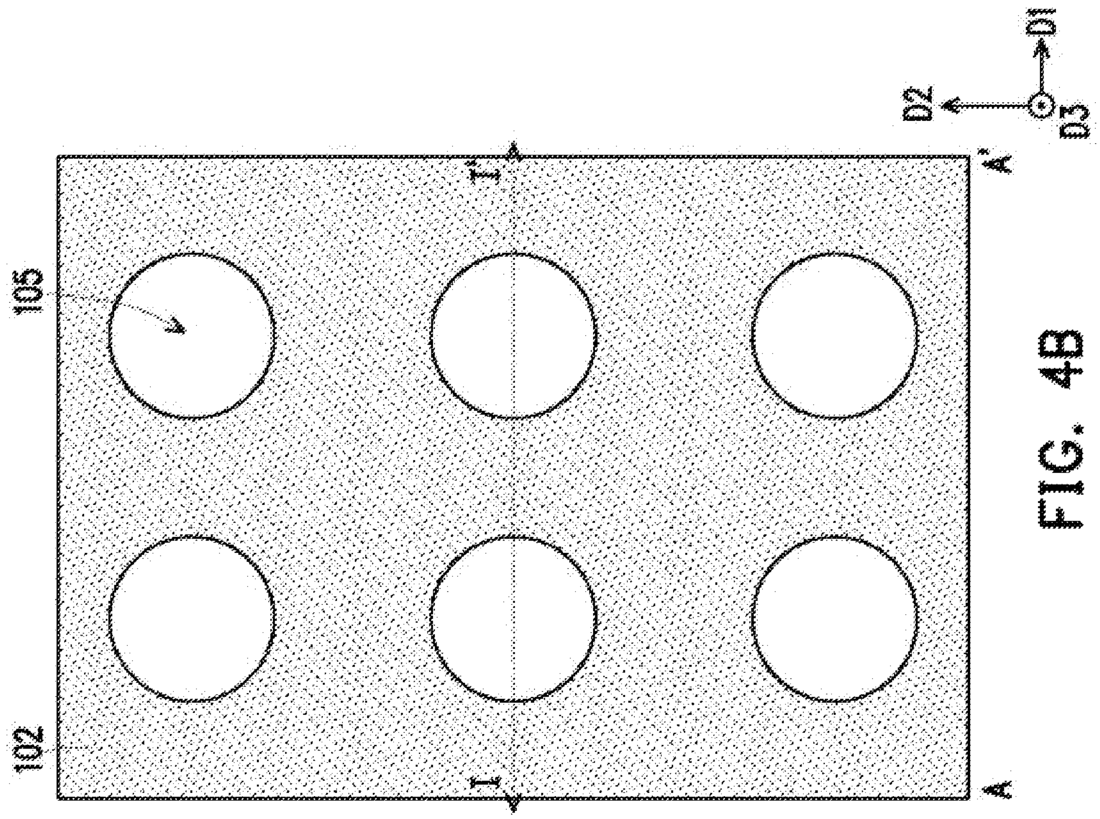
Figure 4A:
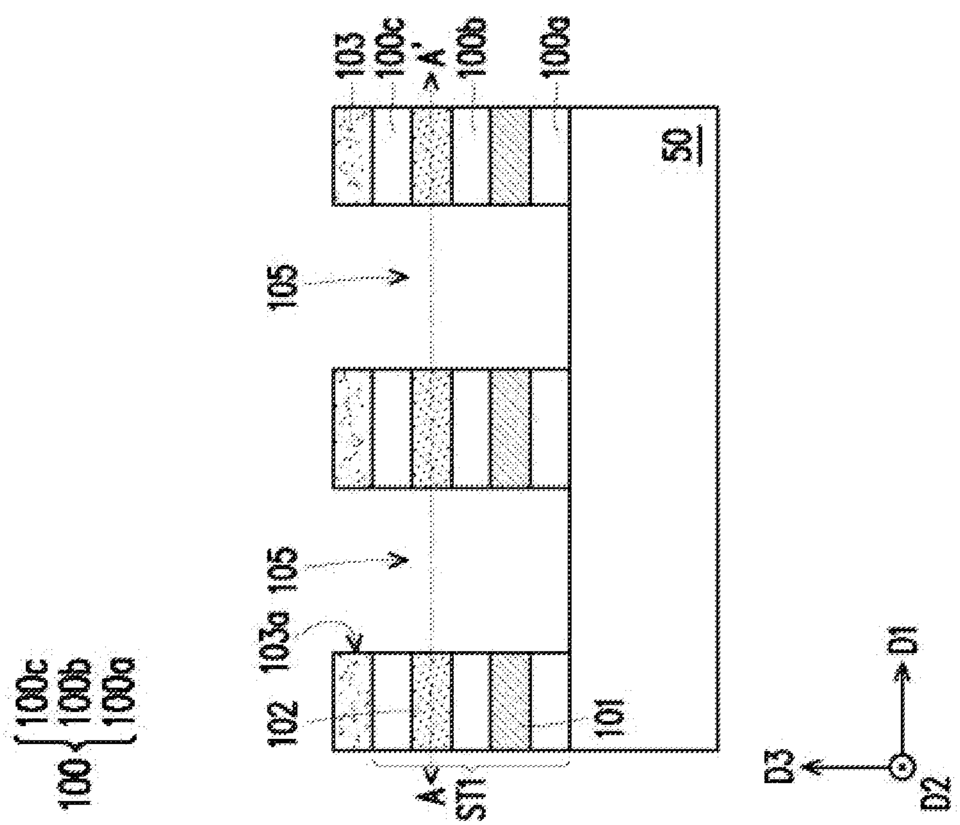

Referring to FIG. 3 and FIG. 4A, the stack structure ST is patterned to form a plurality of through holes 105 therein. The patterning of the stack structure ST may include photolithography and etching processes. For example, as shown in FIG. 3, a patterned mask layer 103 is formed on the stack structure ST. The patterned mask layer 103 has a plurality of openings (such as holes) 103*a*, exposing portions of the top surface of the stack structure ST. The patterned mask layer 103 may include a patterned photoresist formed by a photolithography process. In some embodiments, the patterned mask layer 103 includes one or more hard mask layers and a photoresist layer on the one or more hard mask layers. In such embodiments, the photoresist layer is patterned by photolithography, and the pattern of the photoresist layer is then transferred to the one or more hard mask layers by an acceptable etching process, such as dry etching (e.g., RIE, NBE, or the like), wet etching, the like, or a combination thereof.

Referring to FIG. 3 and FIG. 4A, etching processes are performed using the patterned mask layer 103 as an etching mask to remove portions of the stack structure ST exposed by the openings 103*a* of the patterned mask layer 103, such that the pattern of the patterned mask layer 103 is transferred into the stack structure ST, and a plurality of openings 105 are formed in the stack structure ST. The etching processes may include dry etching, wet etching, or a combination thereof. In some embodiments, the etching processes are anisotropic etching processes.

FIG. 4B illustrates a plan view along line A-A' of FIG. 4A, and FIG. 4A is a cross-sectional view taken along line I-I' of FIG. 4B.

Referring to FIG. 4A and FIG. 4B, in some embodiments, the openings 105 are through holes. The through holes 105 penetrate through the stack structure ST and extend from the top surface of the dielectric layer 100*c* to the bottom surface of the dielectric layer 100*a*. In other words, the through holes 105 are defined by inner sidewalls of the stack structure ST and a top surface of the structure 50 (e.g., a top surface of a dielectric layer). In some embodiments, the through holes 105 may be cylindrical holes, or the like. The cross-sectional shape of the through holes 105 may be rectangle, square, or the like, and the top view of the through holes 105 may be circular, oval, or the like. However, the disclosure is not limited thereto. The through holes 105 may be formed in any suitable shapes.

In some embodiments, a plurality of through holes 105 are formed in the stack structure ST, and the through holes 105 may be, in part, used for defining memory cells. The through holes 105 may be arranged in an array including a plurality of rows and columns along the directions D1 and D2. The directions D1 and D2 may be horizontal directions parallel with a top surface of the substrate 10 (FIG. 1) and may be substantially perpendicular to each other. In some embodiments, the through holes 105 arranged in a same row along the direction D1 may be substantially aligned with each other, while the through holes 105 arranged in a same column along the direction D2 may be substantially aligned with each other. It is noted that the number of the through holes 105 and the arrangement shown in FIG. 4B are merely for illustration, and the disclosure is not limited thereto. Any suitable number of through holes 105 may be formed in the stack structure ST in any suitable arrangement, depending on product design and requirement.

Figure 5B:
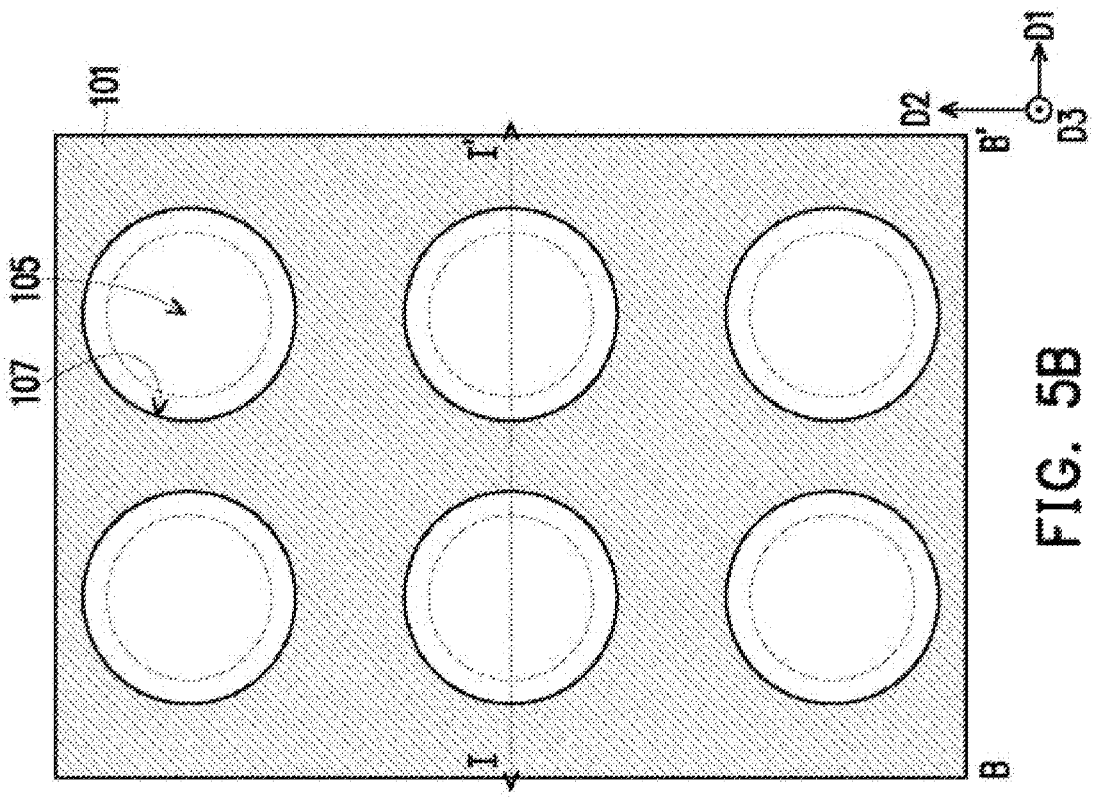
Figure 5A:
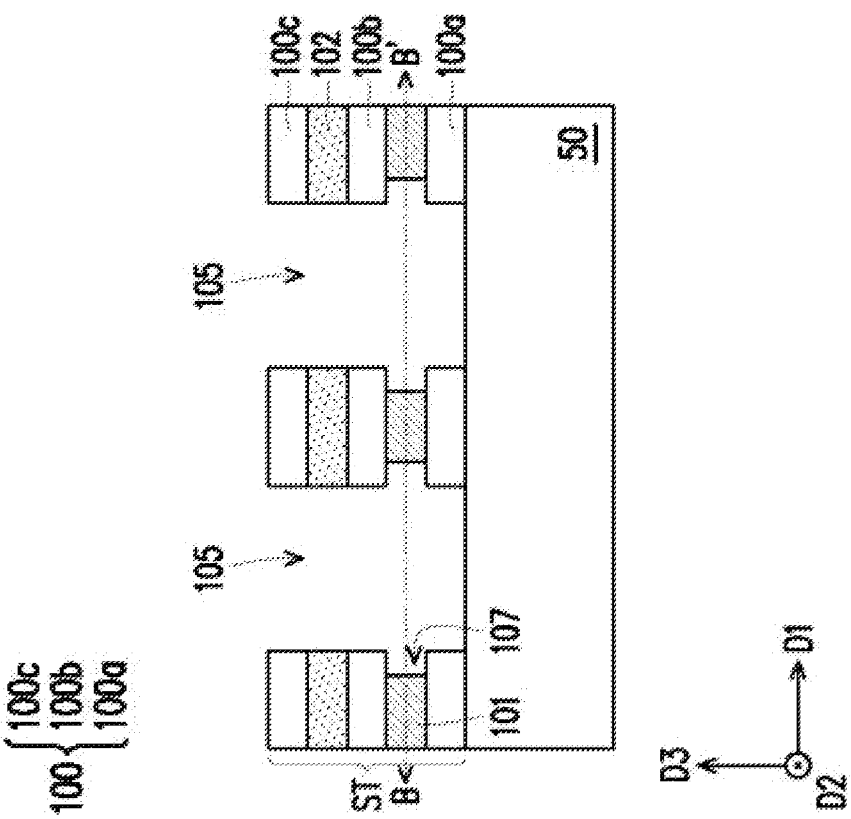

Referring to FIG. 4A and FIG. 5A, the patterned mask layer 103 is removed by an ashing process, a stripping process, the like, or a combination thereof. Portions of the conductive layer 101 exposed by the through holes 105 are removed, such that the conductive layer 101 is laterally recessed to form a plurality of recesses 107. The recesses 107 may also be referred to as lateral recesses. The removal of the conductive layer 101 may include performing an etching process such as wet etching, dry etching, or combinations thereof. The etching process has a high etching selectivity ratio of the conductive layer 101 to adjacent layers (e.g., dielectric layers 100 and sacrificial layer 102) of the stack structure ST, and the adjacent layers are substantially not removed during the etching process. In some embodiments, the etching process may be performed before or after removing the patterned mask layer 103.

FIG. 5B illustrates a plan view along the line B-B' of FIG. 5A, and FIG. 5A is a cross-sectional view taken along line I-I' of FIG. 5B.

Referring to FIG. 5A and FIG. 5B, each of the recesses 107 is in spatial communication with a corresponding one of the through holes 105. In some embodiments, the recesses 107 are defined by inner sidewalls of the conductive layer 101, portions of the top surface of the dielectric layer 100*a*, and portions of the bottom surface of the dielectric layer 100*b*. The top view of the recesses 107 may be ring-shaped, such as circular ring-shaped, oval ring-shaped, or the like. The recesses 107 may be concentric with the corresponding through holes 105. However, the disclosure is not limited thereto Referring to FIG. 6, a data storage material layer 108' is formed to fill the recesses 107 by a suitable deposition process, such as ALD, or the like. In some embodiments, the data storage material layer 108' is also deposited on the top surface of the stack structure ST and in the through holes 105. In some embodiments, the data storage material layer 108' substantially fills up the recesses 107. Various materials may be selected to form the data storage material layer 108' depending on product design and requirement. For example, the data storage material layer 108' may include a phase change material configured for a phase change random access memory (PCRAM) device, a variable resistance material configured for a resistive random access memory (RRAM) device, or a dielectric material configured for a dynamic random access memory (DRAM) device. The details of the various materials configured for different memory devices will be described later below.

Figure 6:
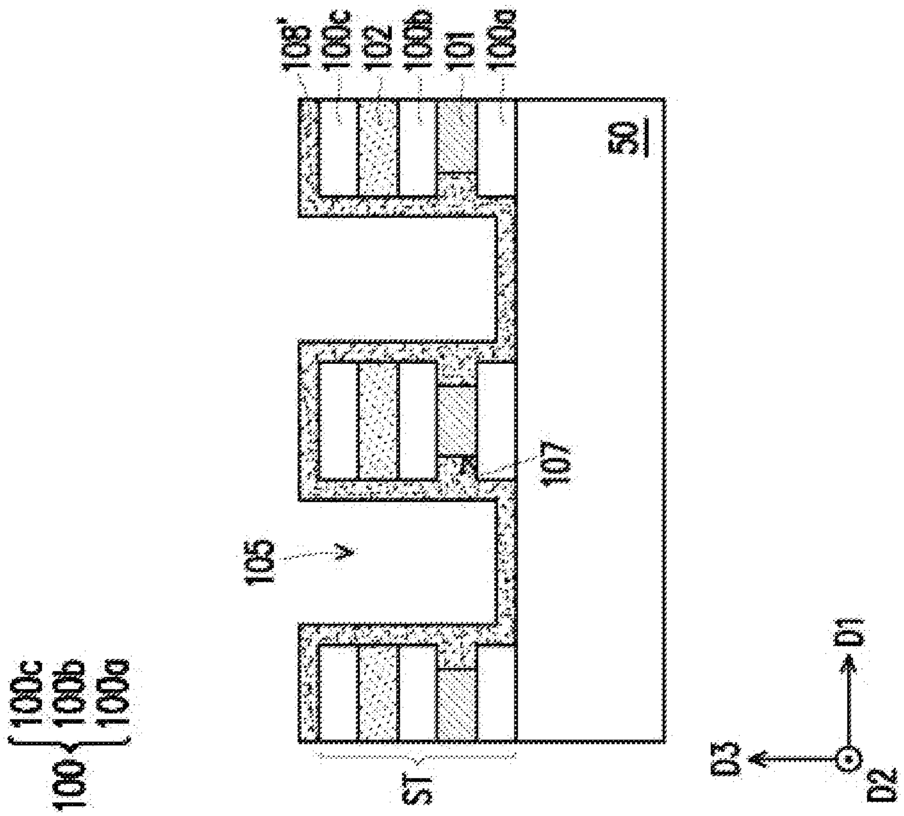
Figure 7B:
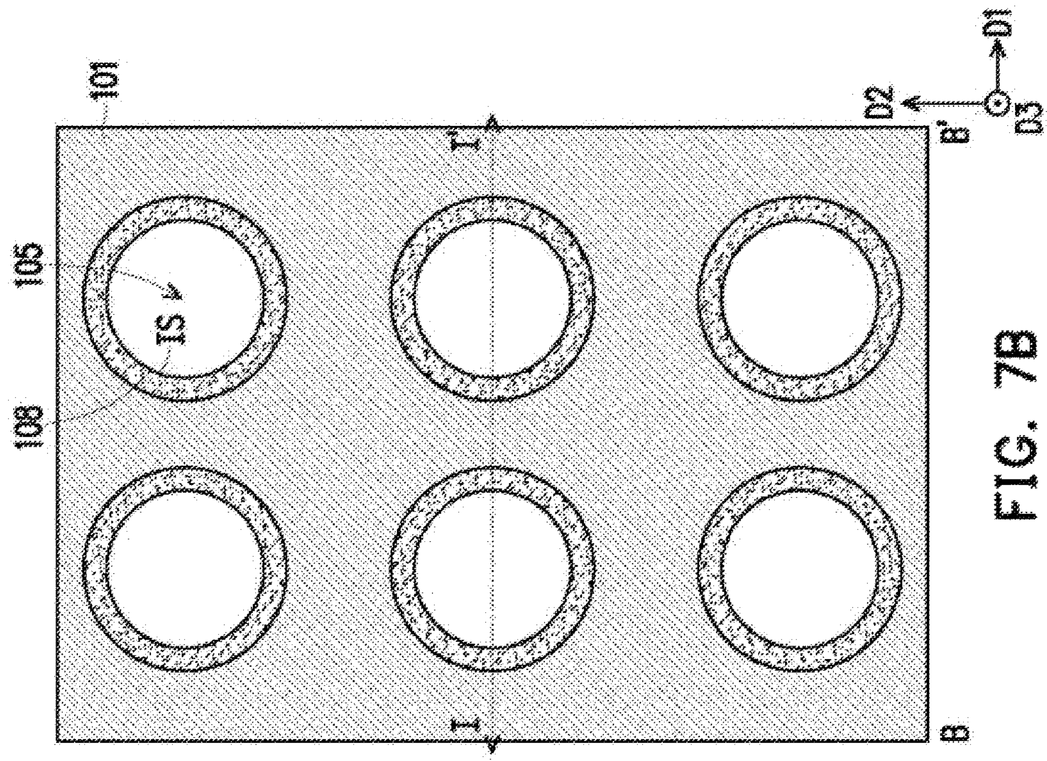
Figure 7A:
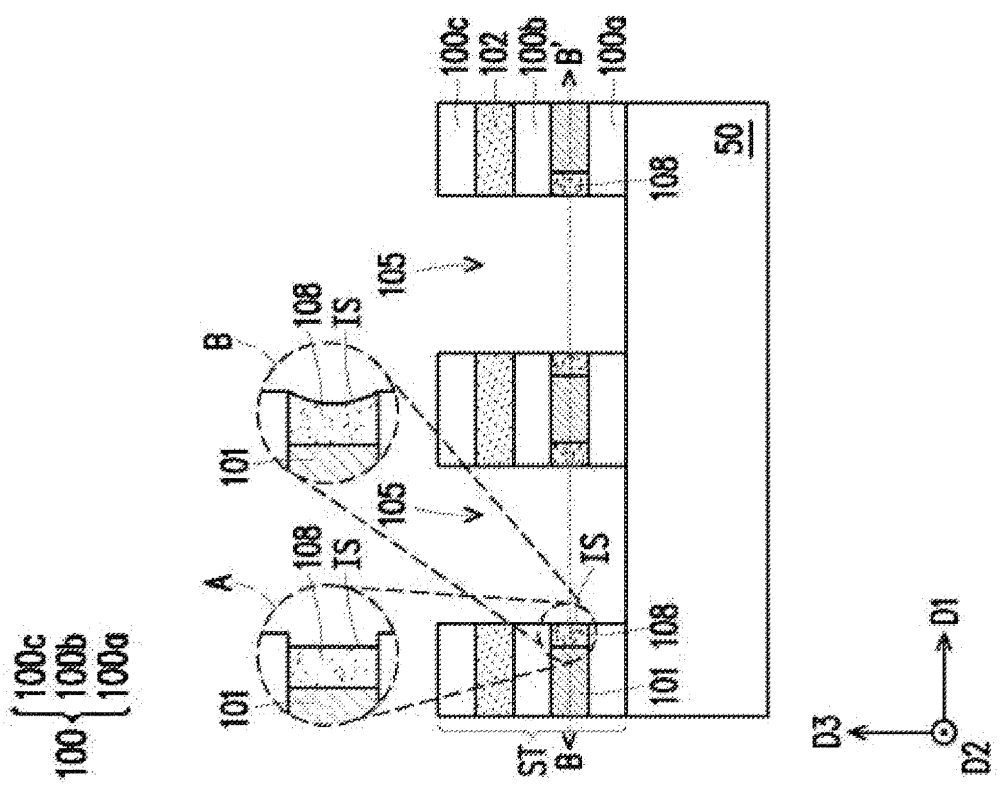

Referring to FIG. 6 and FIG. 7A, portions of the data storage material layer 108' outside the recesses 107 are removed, thereby forming a data storage layer 108 in the recesses 107. The removal of the data storage material layer 108' may include an etching process, such as a dry etching. The etching process may be anisotropic. In some embodiments, the etching process has a high etching selectively ratio of the data storage material layer 108' to other adjacent layers (e.g., dielectric layers 100, sacrificial layer 102 of the stack structure ST, etc.). In some embodiments, the layers of the stack structure ST are substantially not removed during the etching process. By the etching process, portions of the data storage material layer 108' on the top surface of the dielectric layer 100*c* and in the through holes 105 are removed, while portions of the data storage material layer 108' substantially remain within the recesses 107, because of a small volume of the recesses 107. Generally, plasma dry etching etches a layer in wide and flat areas faster than a layer in small concave (e.g., holes, grooves and/or slits) portions, because it may be difficult for the plasma to go into the small concave portions. Therefore, the data storage material layer 108' can remain in the recesses 107 and define the data storage layer 108. In some embodiments, the data storage material layer 108' in the recesses 107 is substantially not removed, and the sidewalls of the resulting data storage layer 108 may be substantially aligned with the sidewalls of the stack structure ST. In some other embodiments, the data storage material layer 108' in the recesses 107 may be slightly etched, and the resulting data storage layer 108 may be slightly recessed from the sidewalls of the stack structure ST.

FIG. 7B is a plan view along the line B-B' of FIG. 7A, and FIG. 7A is a cross-sectional view taken along line I-I' of FIG. 7B.

Referring to FIG. 7A and FIG. 7B, the data storage layer 108 is formed in the recesses 107 of the conductive layer 101. In some embodiments, the top view of the data storage layer 108 is ring-shaped, such as circular ring-shaped or oval ring-shaped, or the like. Outer sidewalls of the data storage layer 108 are in contact with the conductive layer 101, while inner sidewalls of the data storage layer 108 are exposed by the through holes 105. The top and bottom surfaces of the data storage layer 108 are in contact with the dielectric layers 100*b* and 100*a*, respectively.

In some embodiments, the inner sidewalls IS of the data storage layer 108 may be substantially aligned with the sidewalls of the dielectric layers 100 and the sacrificial layer 102 of the stack structure ST defining the through holes 105. In such embodiments, the recesses 107 are substantially completely filled by the data storage layer 108. However, the disclosure is not limited thereto. In alternative embodiments, as shown in the enlarged cross-sectional views A and B, the inner sidewalls IS of the data storage layer 108 may be laterally shift (e.g., laterally recessed) from the sidewalls of the stack structure ST. In such embodiments, the recessed inner sidewalls IS of the data storage layer 108 may be substantially straight or arced toward the conductive layer 101. In other words, the recesses 107 may be partially filled by the data storage layer 108, and the portions of the recesses 107 that are not filled by the data storage layer 108 may or may not expose portions of the top surface of the dielectric layer 100*a* and/or portions of the bottom surface of the dielectric layer 100*b*.

Figure 8A:
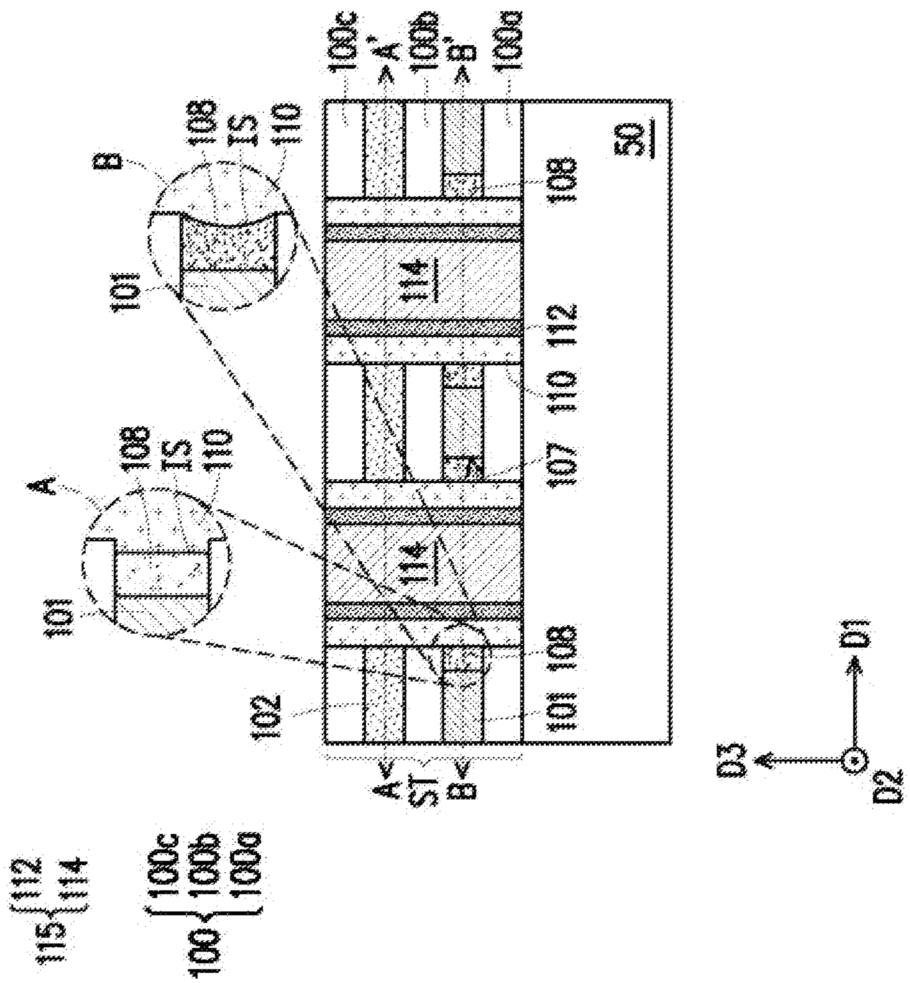

Referring to FIG. 8A, a channel layer 110, a dielectric layer 112 and a conductive layer 114 are formed in each of the through holes 105. The channel layer 110 includes a material suitable for providing a channel region for a transistor. In some embodiments, the channel layer 110 includes a metal oxide, an oxide semiconductor, or a combination thereof. The material of the channel layer 110 may be or include amorphous indium gallium zinc oxide (IGZO), indium zinc oxide (IZO), indium gallium oxide, other applicable materials, or combinations thereof. In some embodiments, the channel layer 110 covers and physically contacts sidewalls of the dielectric layers 100 and the sacrificial layer 102 and the data storage layer 108. In some embodiments in which the data storage layer 108 is laterally recessed from the sidewalls of the stack structure ST, portions of the channel layer 110 may laterally extend to fill portions of the recesses 107 that are not filled by the data storage layer 108, and the portions of the channel layer 110 may be or may not be in contact with the top surface of the dielectric layer 100*a* and/or the bottom surface of the dielectric layer 100*b*, as shown in the enlarged cross-sectional views A and B.

The dielectric layer 112 is laterally sandwiched between the conductive layer 114 and the channel layer 110. In some embodiments, the dielectric layer 112 may include, for example, silicon oxide, silicon nitride, silicon oxynitride, or the like. In alternative embodiments, the dielectric layer 112 may include a ferroelectric material configured for a ferroelectric field effect transistor (FeFET), which will be described in detail below. The conductive layer 114 is laterally surrounded by the dielectric layer 112 and the channel layer 110, and may also be referred to as conductive pillars. The combination of the conductive pillars 114 and the dielectric layer 112 may also be referred to as pillar structures 115. The conductive layer 114 includes a suitable conductive material, such as, copper, titanium, titanium nitride, tantalum, tantalum nitride, tungsten, ruthenium, aluminum, combinations thereof, or the like. The forming method for each of the channel layer 110, the dielectric layer 112, and the conductive layer 114 may include a suitable deposition process, such as CVD, PVD, ALD, PECVD, or the like. In some embodiments, the top surfaces of the channel layer 110, the dielectric layer 112 and the conductive layer 114 are substantially coplanar with the top surface of the dielectric layer 100*c*.

In some embodiments, the bottoms of the channel layer 110 and the dielectric layer 112 are open, and the bottom surface of the conductive layer 114 is exposed. The bottom surfaces of the channel layer 110, the dielectric layer 112 and the conductive layer 114 may be substantially coplanar with each other. In such embodiments, the formation of the channel layer 110, the dielectric layer 112 and the conductive layer 114 may include depositing a channel material over the stack structure ST to fill the through holes 105. The channel material covers the top surface of the stack structure ST and lines the sidewalls and bottom surfaces of the through holes 105. Thereafter, an etching process, such as an etching back process, is performed to remove horizontal portions of the channel material on the top surface of the stack structure ST and on the bottom surfaces of the through holes 105, thereby forming the channel layer 110 lining the sidewalls of the through holes 105.

Thereafter, a process similar to that of the channel layer 110 is performed to form the dielectric layer 112. For example, a dielectric material is deposited on the top surface of the stack structure ST and fills in the through holes 105 to cover sidewalls of the channel layer 110 and the bottom surfaces of the through holes 105. Thereafter, an etching process, such as an etching back process, is performed to remove horizontal portions of the dielectric material on the top surface of the stack structure ST and on the bottom surfaces of the through holes 105, while the dielectric material remains on sidewalls of the channel layer 110, to form the dielectric layer 112. Afterwards, a conductive material is deposited over the stack structure ST and filling the remaining portions of the through holes 105 that are not filled by the channel layer 110 and the dielectric layer 112. An etching back process or a planarization process (e.g., chemical mechanical polishing (CMP)) is then performed to remove the excess portions of the conductive material over the top surface of the stack structure ST. However, the disclosure is not limited thereto.

Figure 8C:
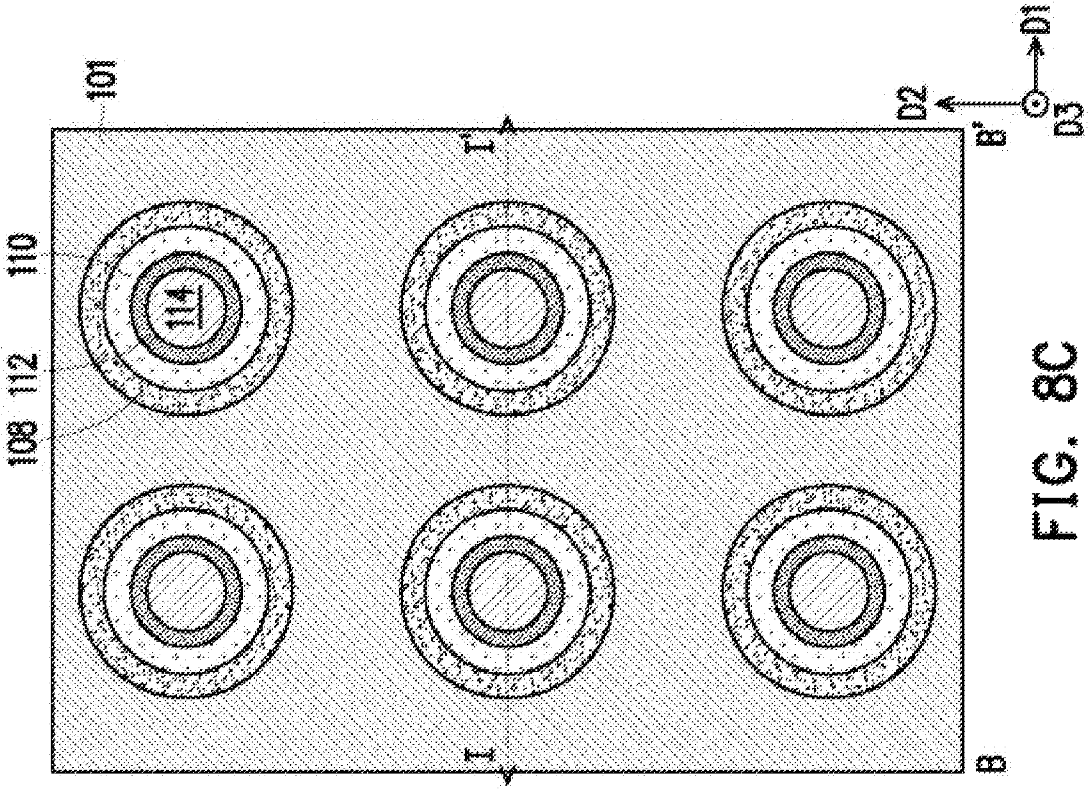
Figure 8B:
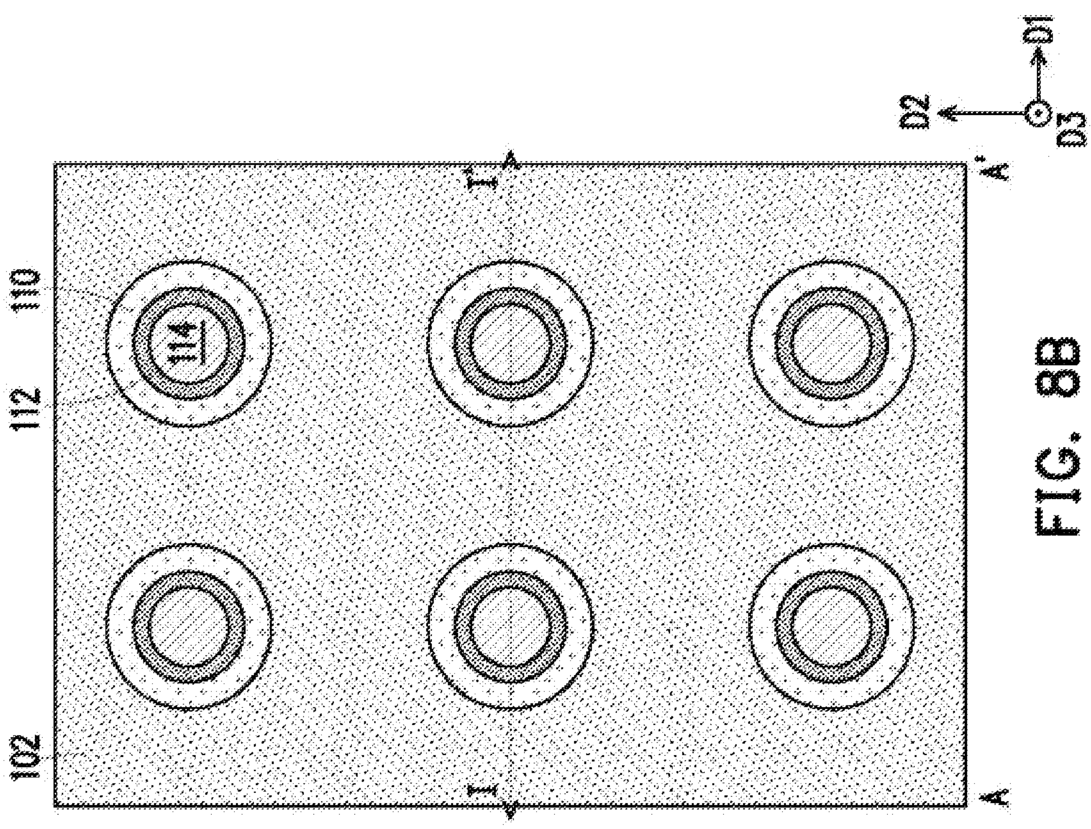
Figure 9A:
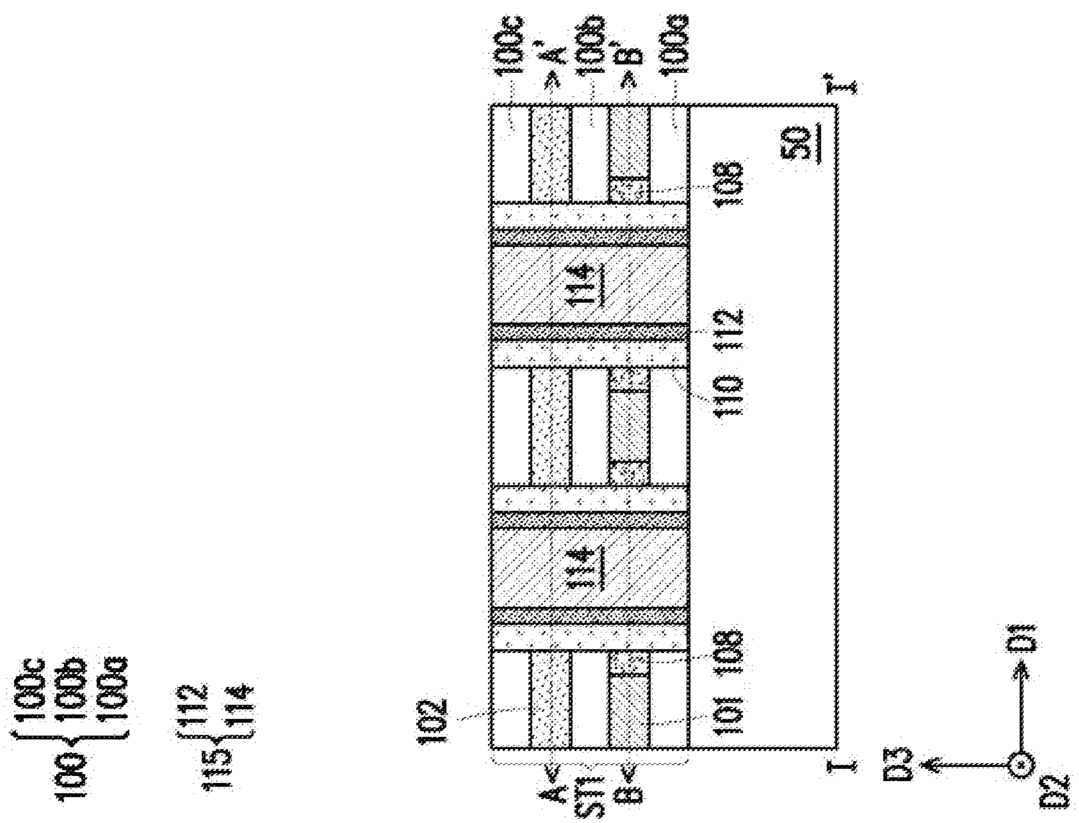
Figure 9B:
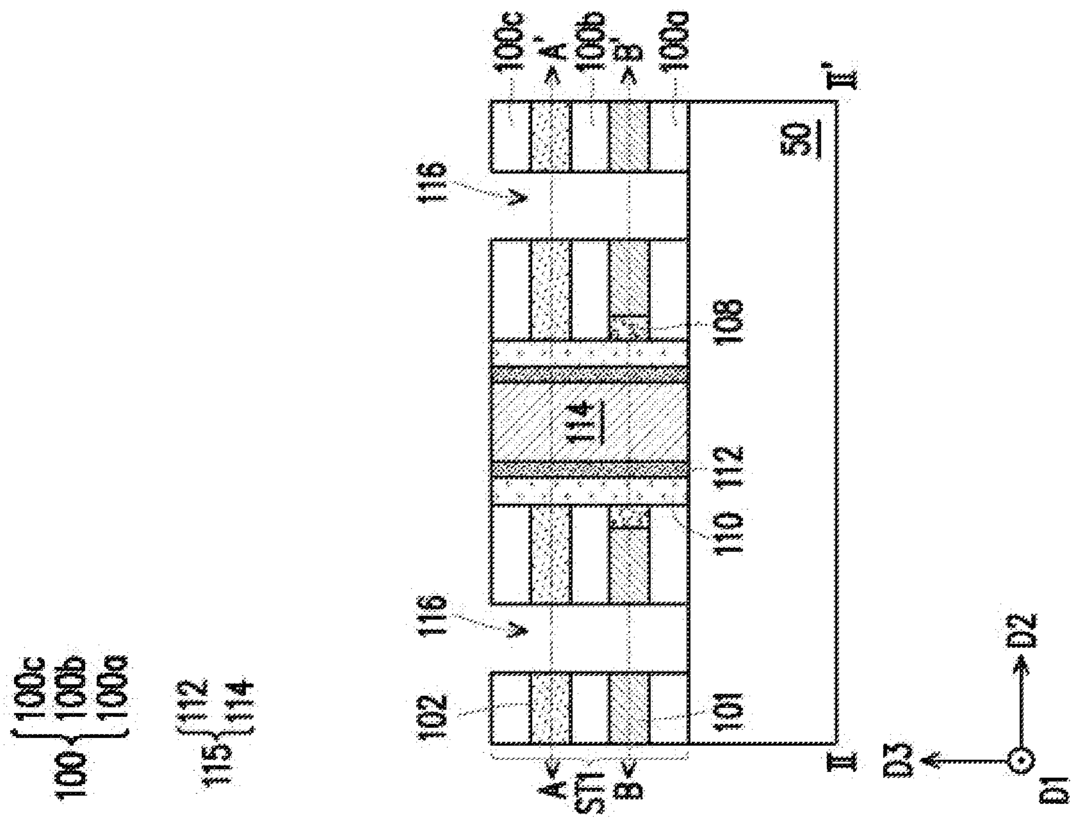
Figure 9D:
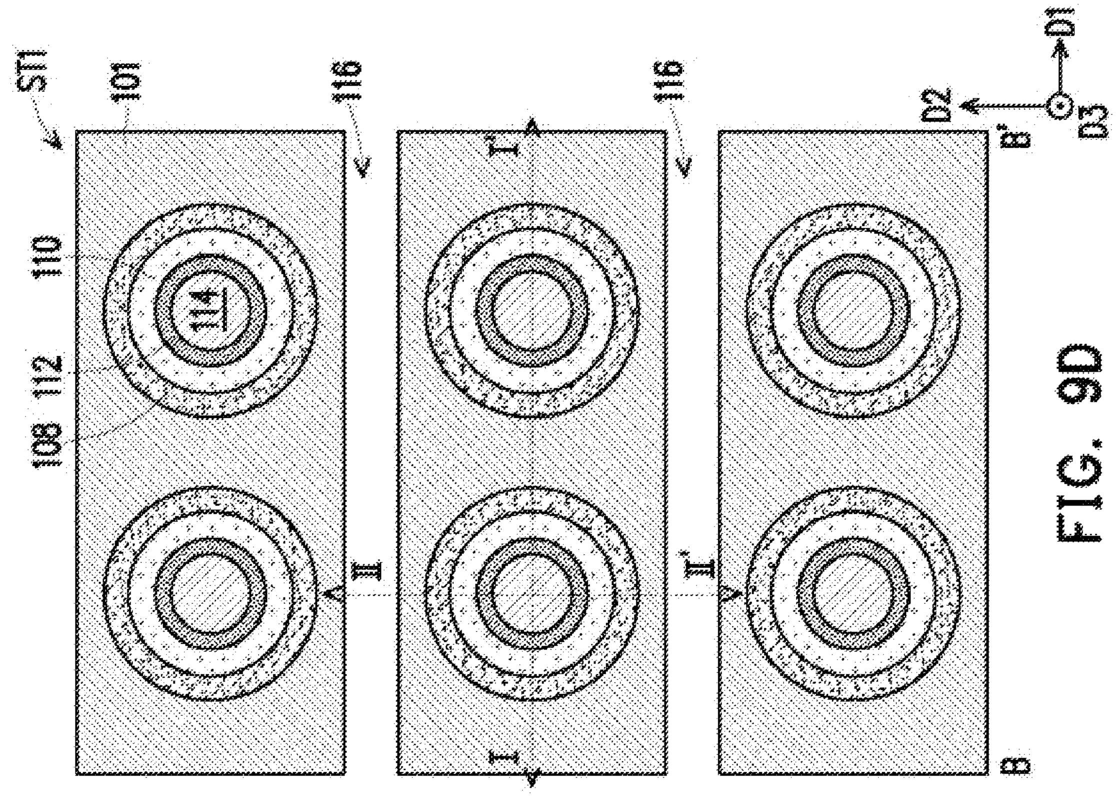
Figure 9C:
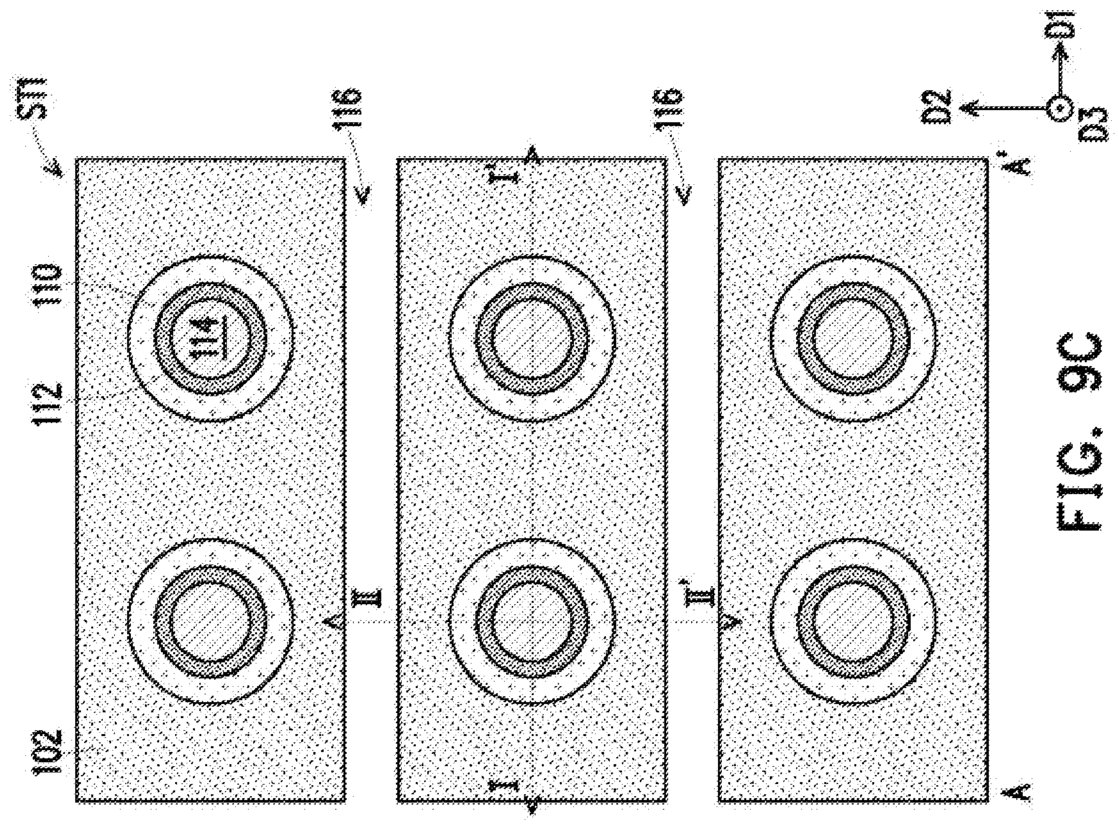
Figure 10B:
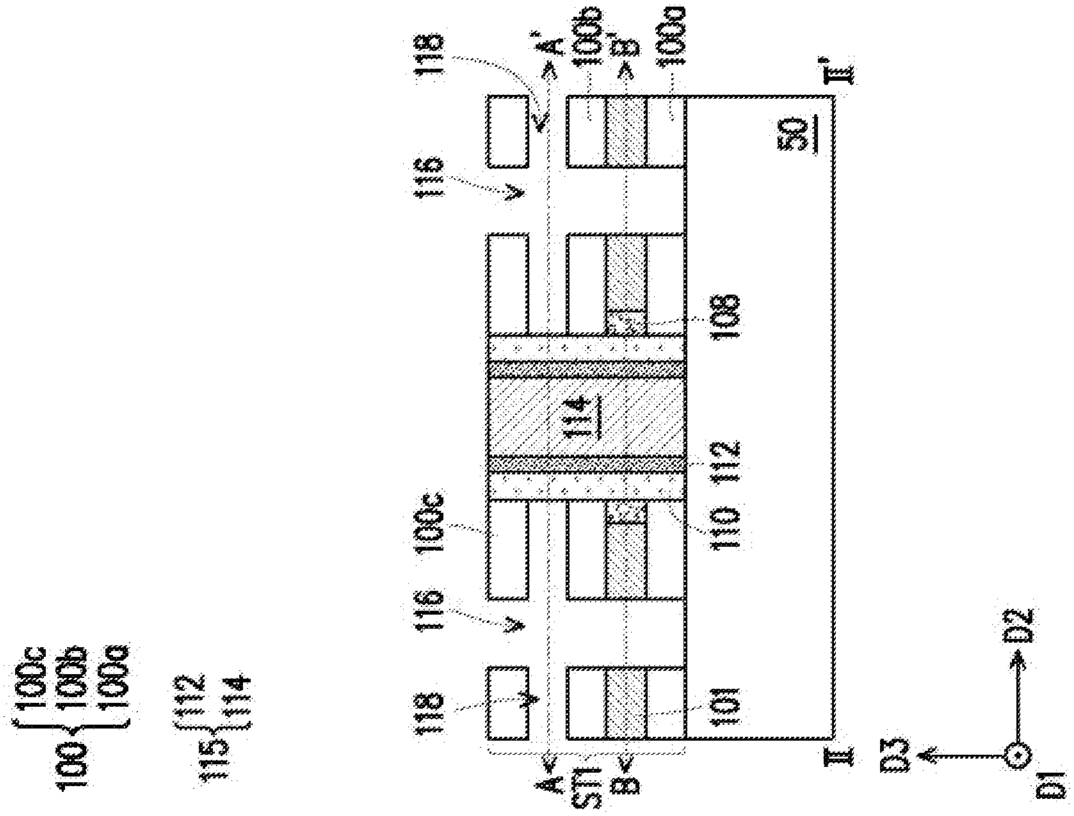
Figure 10A:
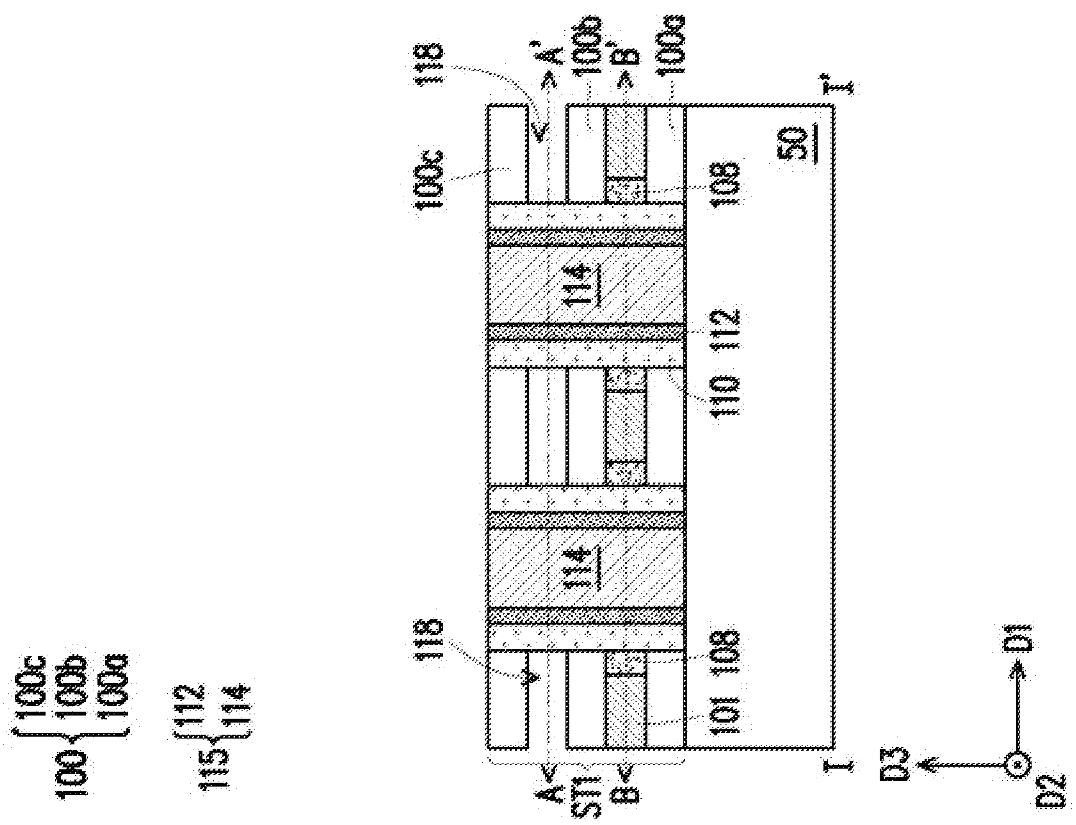
Figure 10D:
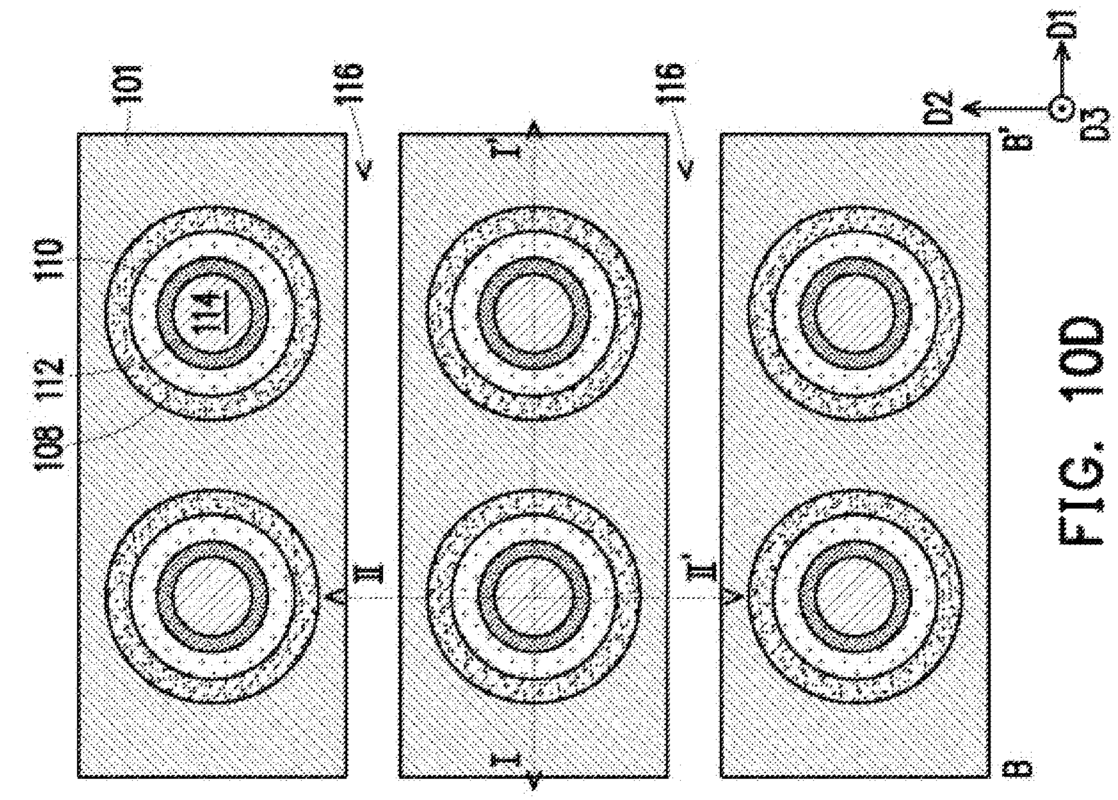
Figure 10C:
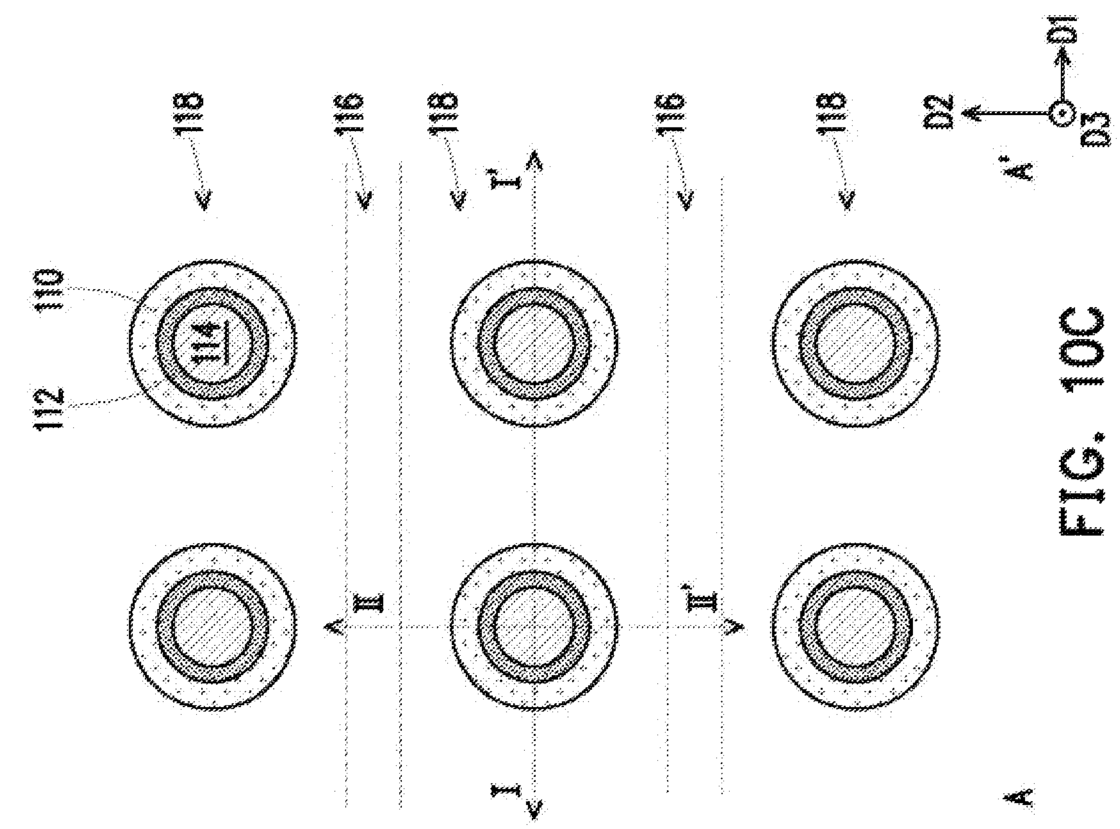
Figure 11B:
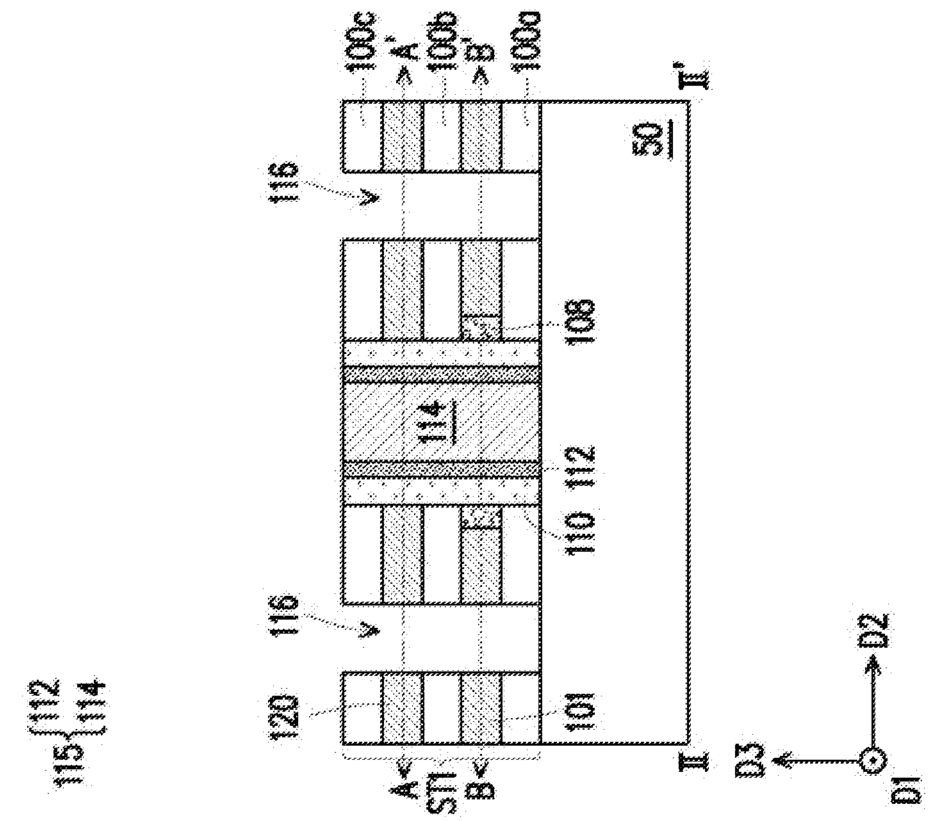
Figure 11A:
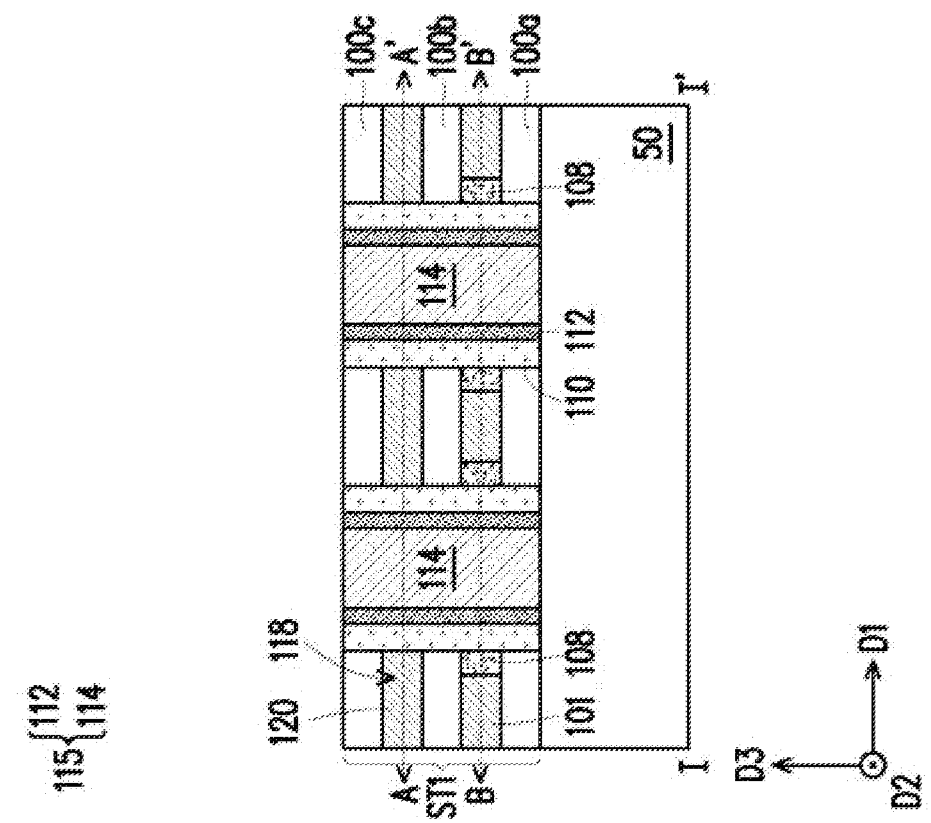
Figure 11D:
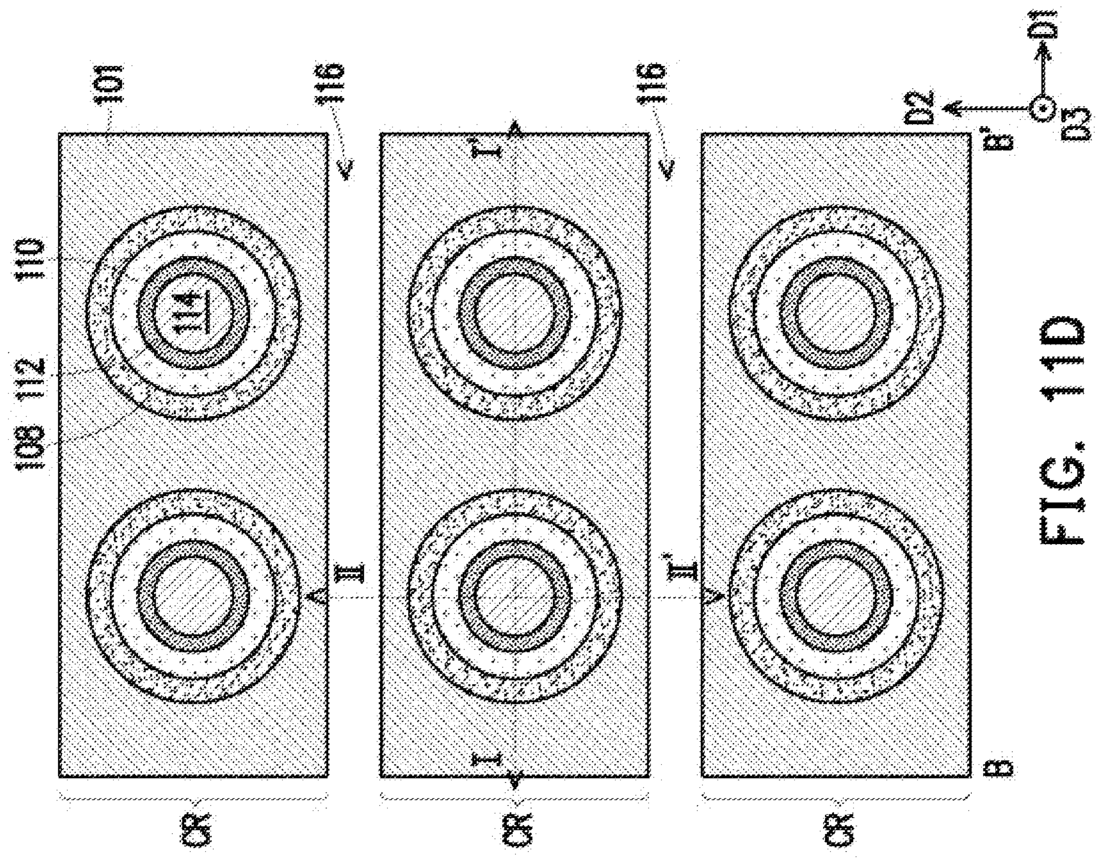
Figure 11C:
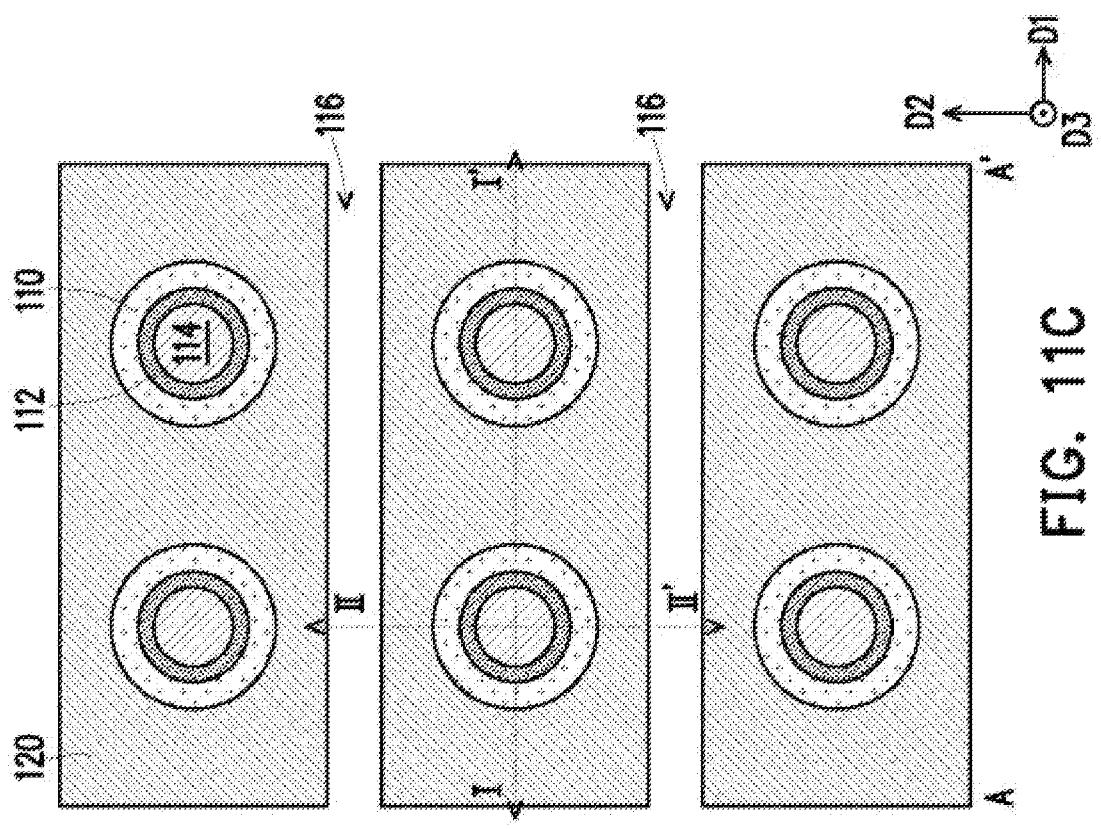
Figure 12B:
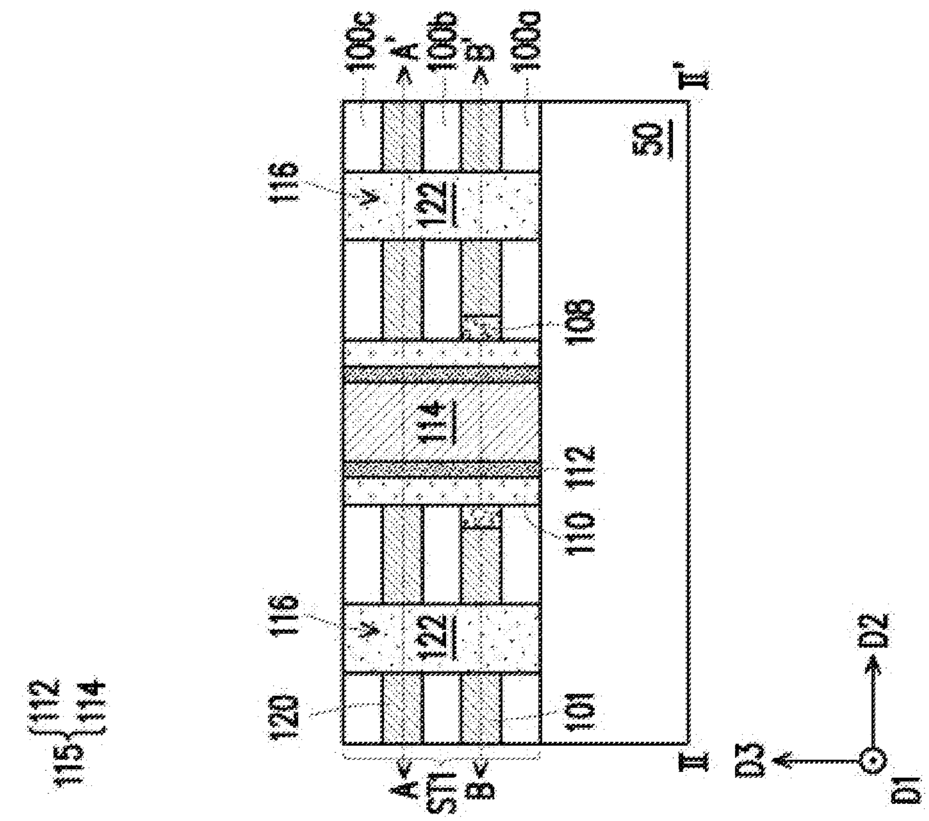
Figure 12A:
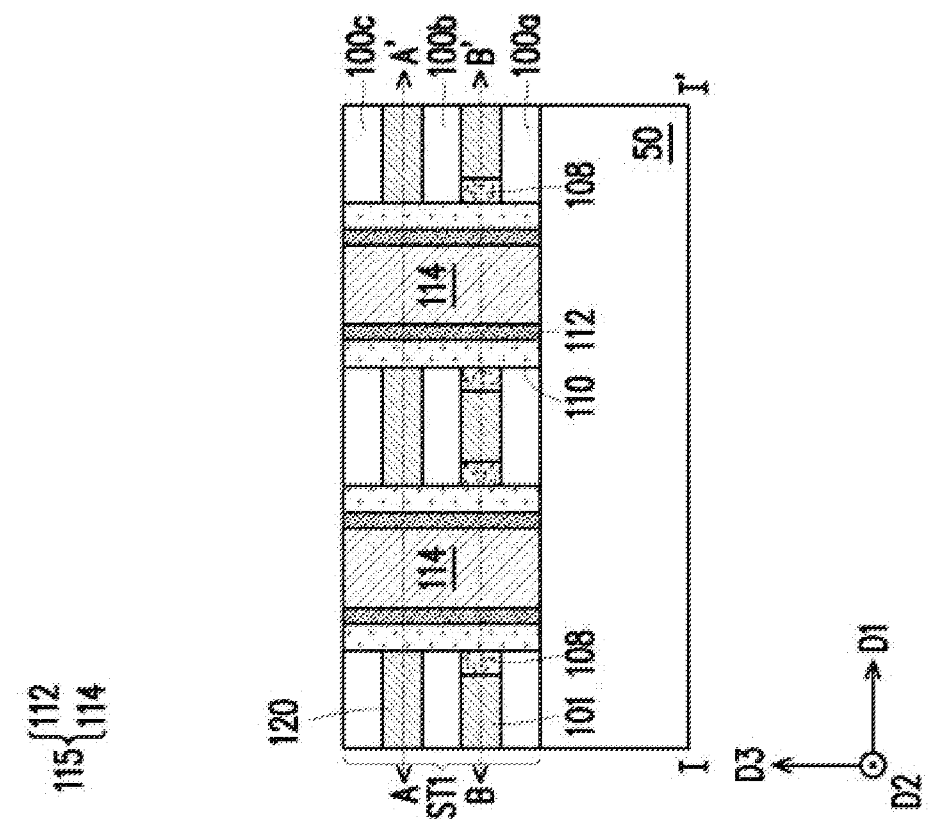
Figure 12D:
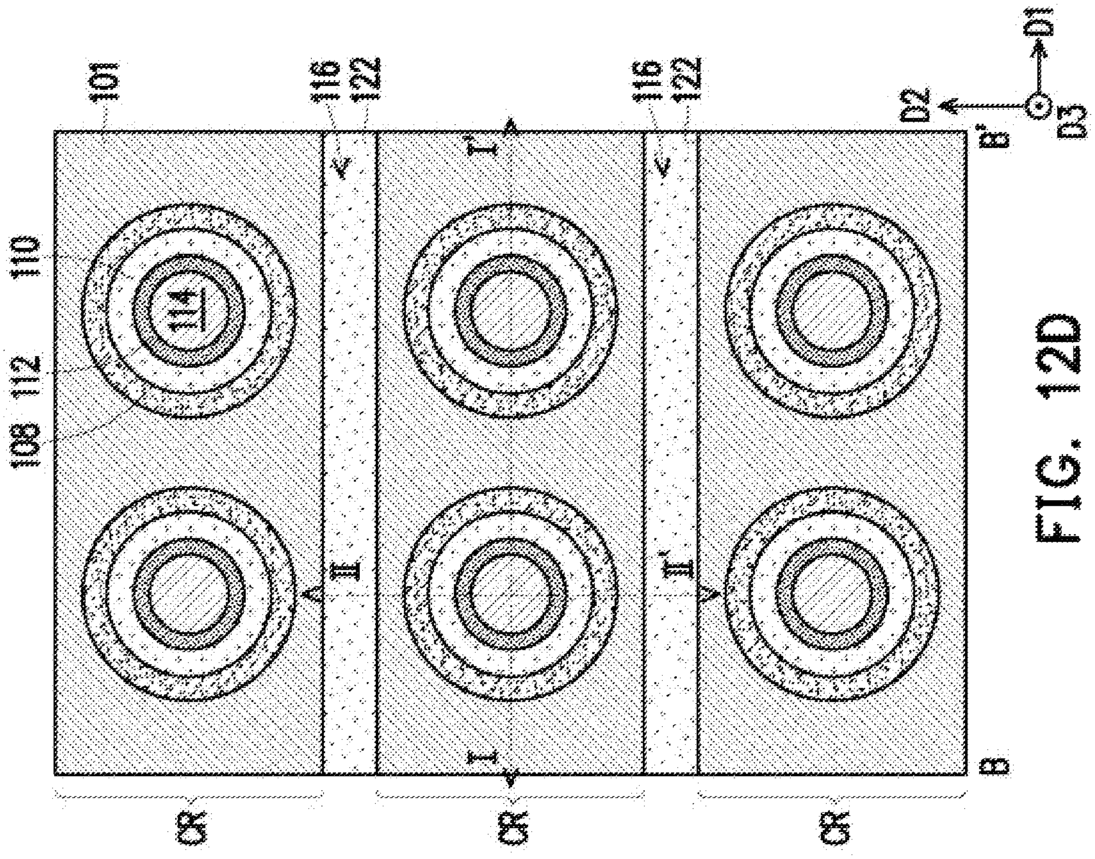
Figure 12C:
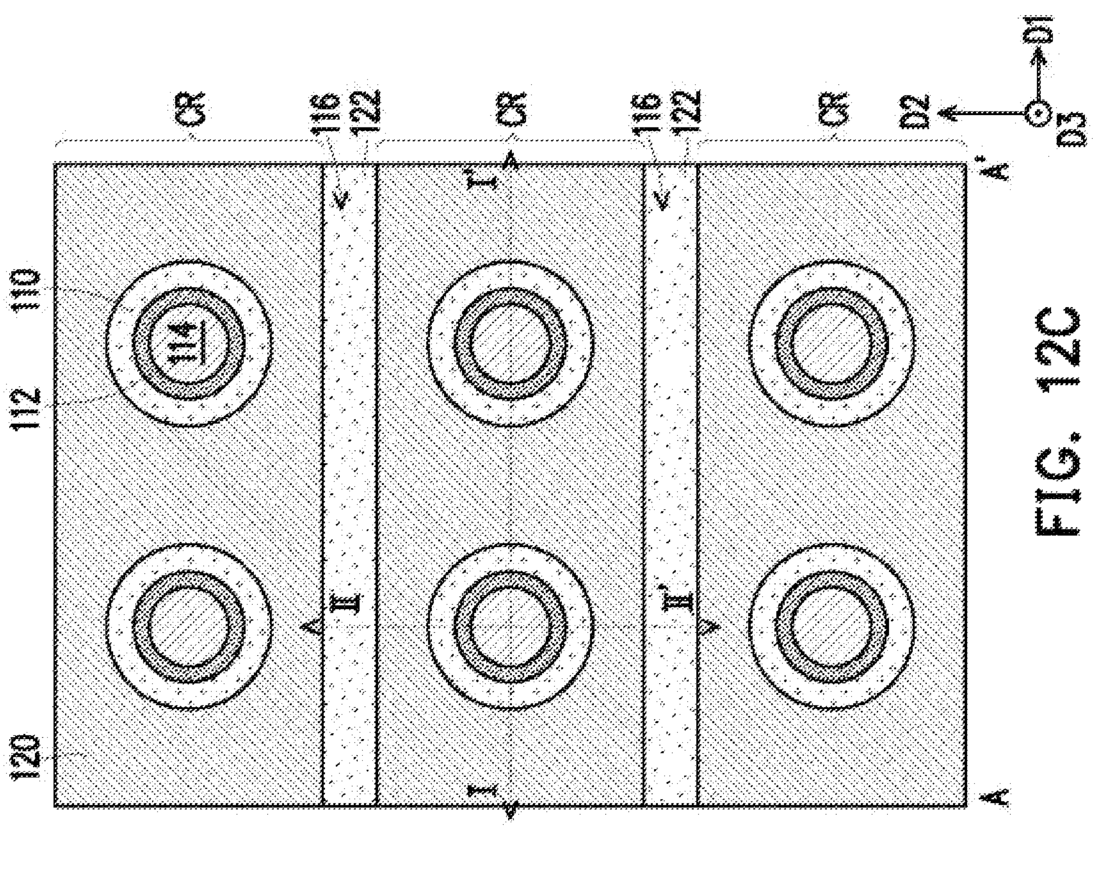

FIG. 8B and FIG. 8C illustrate plan views along lines A-A' and B-B' of FIG. 8A, respectively, and FIG. 8A is a cross-sectional view taken along a line I-I' of FIG. 8B or 8C.

Referring to FIG. 8A to FIG. 8C, in some embodiments, the plan views of the channel layer 110 and the dielectric layer 112 are ring-shaped, such as circular ring-shaped, oval ring-shaped, or the like. The top view of the conductive layer 114 may be circular, oval, or the like.

FIGS. 9A-9D to FIGS. 13A-13D illustrate the subsequent process with cross-sectional views and plan views. FIG. 9A to FIG. 13A are cross-sectional views taken along lines I-I' of FIGS. 9C/9D to FIG. 13C/13D, respectively. FIG. 9B to FIG. 13B are cross-sectional views taken along line II-II' of FIGS. 9C/9D to FIG. 13C/13D, respectively. FIG. 9C to FIG. 13C are plan views along lines A-A' of FIGS. 9A/9B to FIGS. 13A/13B, respectively. FIG. 9D to FIG. 13D are plan views along lines B-B' of FIGS. 9A/9B to FIGS. 13A/13B, respectively.

Referring to FIG. 9A to FIG. 9D, thereafter, the stack structure ST is patterned to form slit trenches 116. The slit trenches 116 cut through the stack structure ST to define cell regions, and a stack structure ST1 with slit trenches 116 is formed. The pattering method may include photolithography and etching processes. For example, a patterned mask layer (not shown) is formed on the stack structure ST, and etching processes using the patterned mask layer as an etching mask is performed to remove portions of the dielectric layers 100, the sacrificial layer 102, and the conductive layer 101 of the stack structure ST. In some embodiments, the slit trenches 116 may vertically extend from the top surface of the dielectric layer 100*c* to the bottom surface of the dielectric layer 100*a* along the direction D3 perpendicular to the substrate 10 (FIG. 1). The sidewalls of the slit trenches 116 expose the dielectric layers 100, the conductive layer 101 and the sacrificial layer 102 of the stack structure ST1. In some embodiments, a plurality of slit trenches 116 are formed to laterally extend in parallel along the direction D1 and divide the stack structure ST1 into a plurality of discrete sections for defining cell regions. The discrete sections of the stack structure ST1 are arranged along the direction D2 and are separated from each other by the slit trenches 116.

Referring to FIG. 9A to FIG. 9D and FIG. 10A to FIG. 10D, the sacrificial layer 102 exposed by the slit trenches 116 is removed, and a cavity 118 is formed between the dielectric layers 100*b* and 100*c* and laterally aside the channel layer 110 and the pillar structures 115. The cavity 118 is in spatial communication with the slit trenches 116. The removal of the sacrificial layer 102 may include an etching process, such as wet etching, dry etching, or a combination thereof. The etching process has a high etching selectivity ratio of the sacrificial layer 102 to adjacent layers (e.g., dielectric layers 100, conductive layer 101, etc.). In some embodiments, the sacrificial layer 102 is completely removed, while the dielectric layers 100 and the conductive layer 101 are substantially not removed.

Referring to FIG. 11A to FIG. 11D, a conductive layer 120 is formed in the cavity 118. The conductive layer 120 may include a material similar to, the same as or different from that of the conductive layer 101. For example, the conductive layer 120 may include metal, metal nitride or metal alloy, such as copper, titanium, titanium nitride, tantalum, tantalum nitride, tungsten, ruthenium, aluminum, alloys thereof, combinations thereof, or the like. The formation of the conductive layer 120 may include depositing a conductive material over the stack structure ST1 by a suitable deposition process, such as ALD, CVD, PVD, PECVD, the like, or combinations thereof. The conductive material may cover the top surface of the stack structure ST1 and fill into the slit trenches 116 and the cavity 118. Thereafter, portions of the conductive material outside the cavity 118 (i.e., on the top surface of the stack structure ST1 and in the slit trenches 116) are removed, while the conductive material remains in the cavity 118, to form the conductive layer 120. The removal of the conductive material may include an etching process, such as a dry etching process. In some embodiments, the etching process is anisotropic, such that the conductive material in the cavity 118 and the conductive layer 101 are substantially not removed during the etching process. The processes shown from FIGS. 9A-9D to FIG. 11A-11D may also be referred to as a metal replacement process. In the embodiments of the disclosure, the conductive layer 120 is formed by a metal replacement process, while the conductive layer 101 is not formed by a metal replacement process, but is formed at the beginning of the fabrication process (i.e., at the formation of the stack structure ST1).

Referring to FIG. 12A to FIG. 12D, after the conductive layer 120 is formed in the cavity 118, an insulating material is formed in the slit trenches 116 to form isolation structures 122. The insulating material may include silicon oxide, silicon nitride, silicon oxynitride, the like, or combinations thereof. The formation of the insulating material may include depositing the insulating material in the slit trenches 116 and over the top surface of the dielectric layer 100*c*. Thereafter, a planarization process, such as CMP is performed to remove excess portions of the insulating material over the top surface of the dielectric layer 100*c*, while the insulating material remains in the slit trenches 116, to form the isolation structures 122. The isolation structures 122 penetrate through the stack structure ST1 and separate the stack structure ST1 into a plurality of sections for defining memory cell regions. In some embodiments, each section of the stack structure ST1 corresponds to a memory cell region.

For example, a plurality of isolation structures 122 extend in parallel in the direction D1, and separate the stack structure ST1 into a plurality of sections arranged along the direction D2, to define a plurality of cell regions CR. In other words, the cell regions CR are arranged along the direction D2 and are separated from each other by the isolation structures 122.

Referring to FIG. 13A to FIG. 13D, in some embodiments, a dielectric layer 123 is formed on the stack structure ST1 by a suitable deposition process such as CVD, PECVD, or the like. The dielectric layer 123 may include silicon oxide, silicon nitride, silicon oxynitride, the like, or combinations thereof. A plurality of conductive vias 125 are formed in the dielectric layer 123 and landing on the conductive pillars 114. A plurality of conductive lines 126 are formed on the dielectric layer 123 and electrically connected to the conductive pillars 114 through the conductive vias 125. The conductive vias 125 and conductive lines 126 may include materials selected from the same candidate materials of the conductive layer 101, 120 or 114. For example, the conductive vias 125 and the conductive lines 126 may include metal, metal nitride or metal alloy, such as copper, titanium, titanium nitride, tantalum, tantalum nitride, tungsten, ruthenium, aluminum, alloys thereof, combinations thereof, or the like. In some embodiments, additional dielectric layers (not shown) are disposed on the dielectric layer 123 to cover sidewalls and/or top surfaces of the conductive lines 126. The conductive vias 125 and the conductive lines 126 may be formed using any suitable process, such as single-damascene process, dual-damascene process, or the like.

Figure 13A:
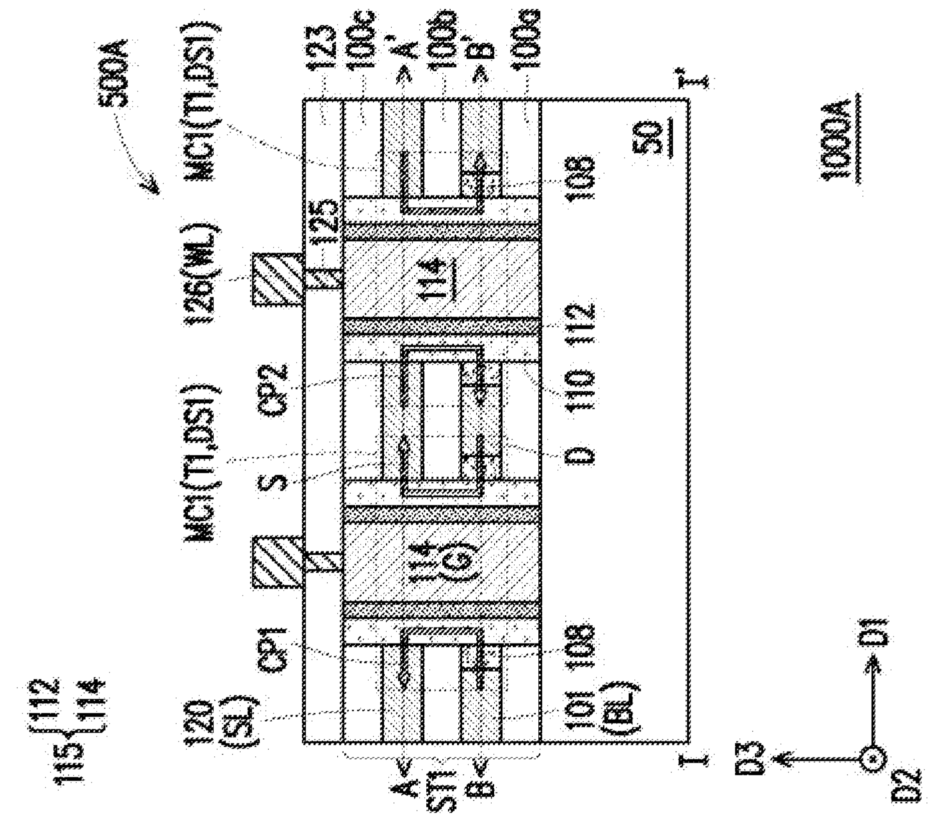
Figure 13B:
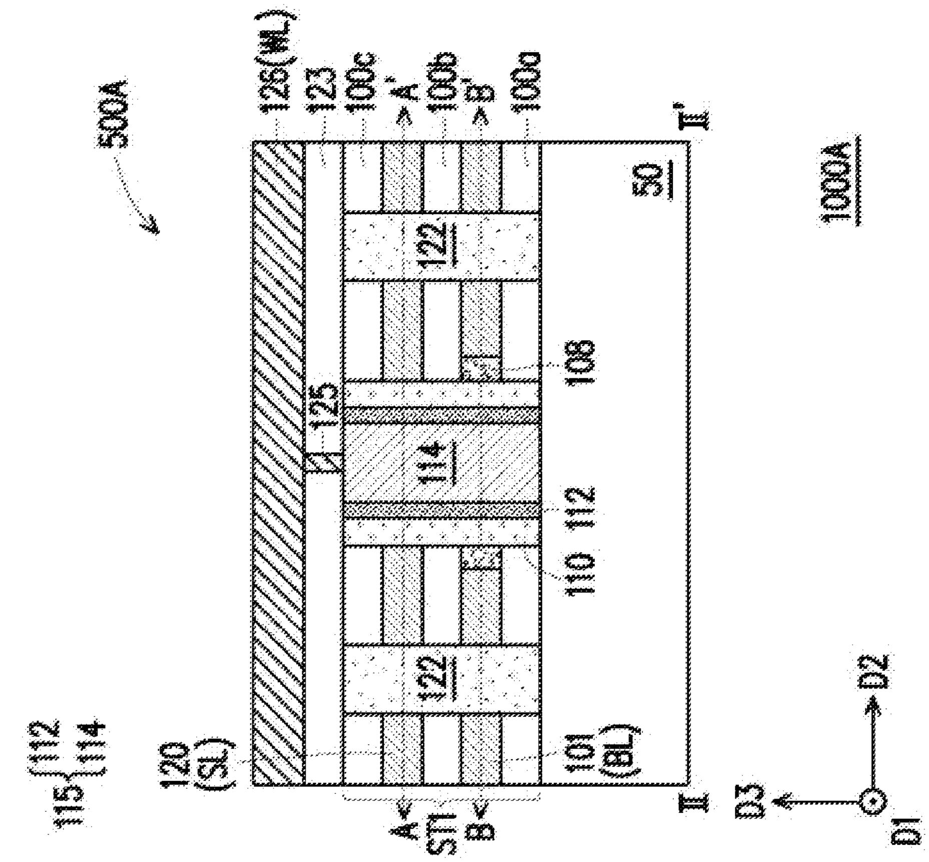
Figure 13D:
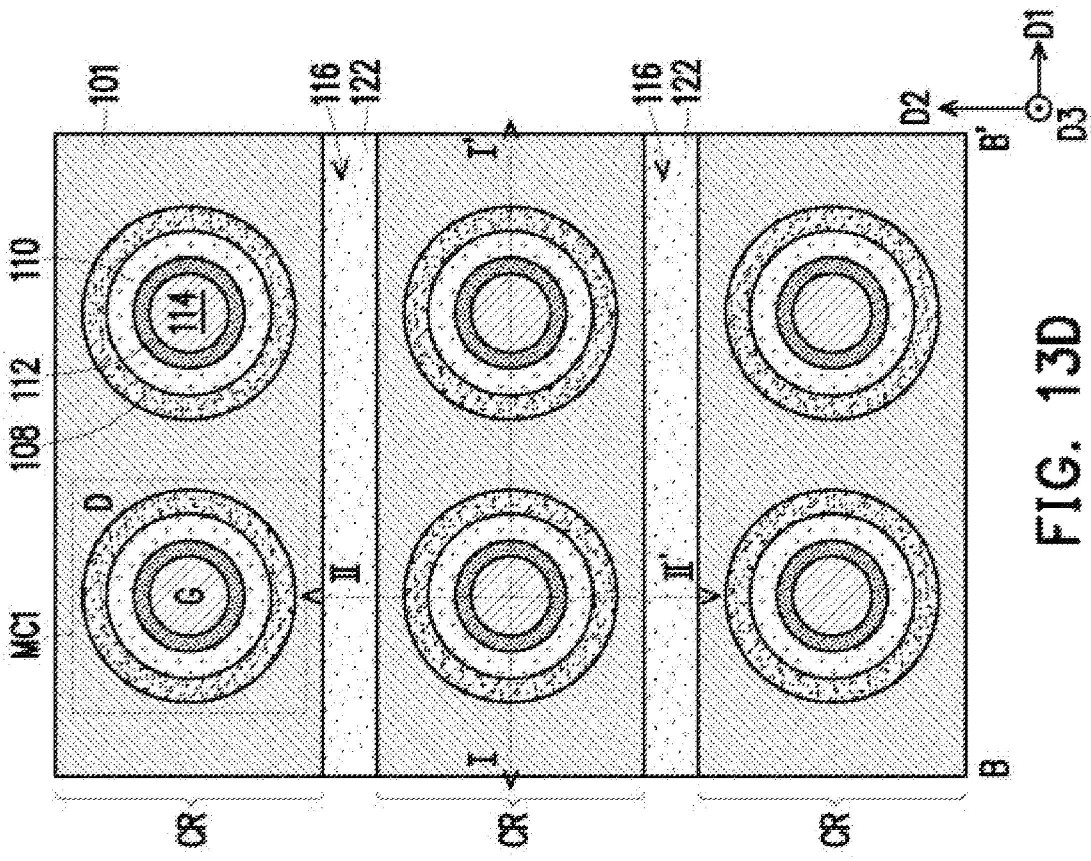
Figure 13C:
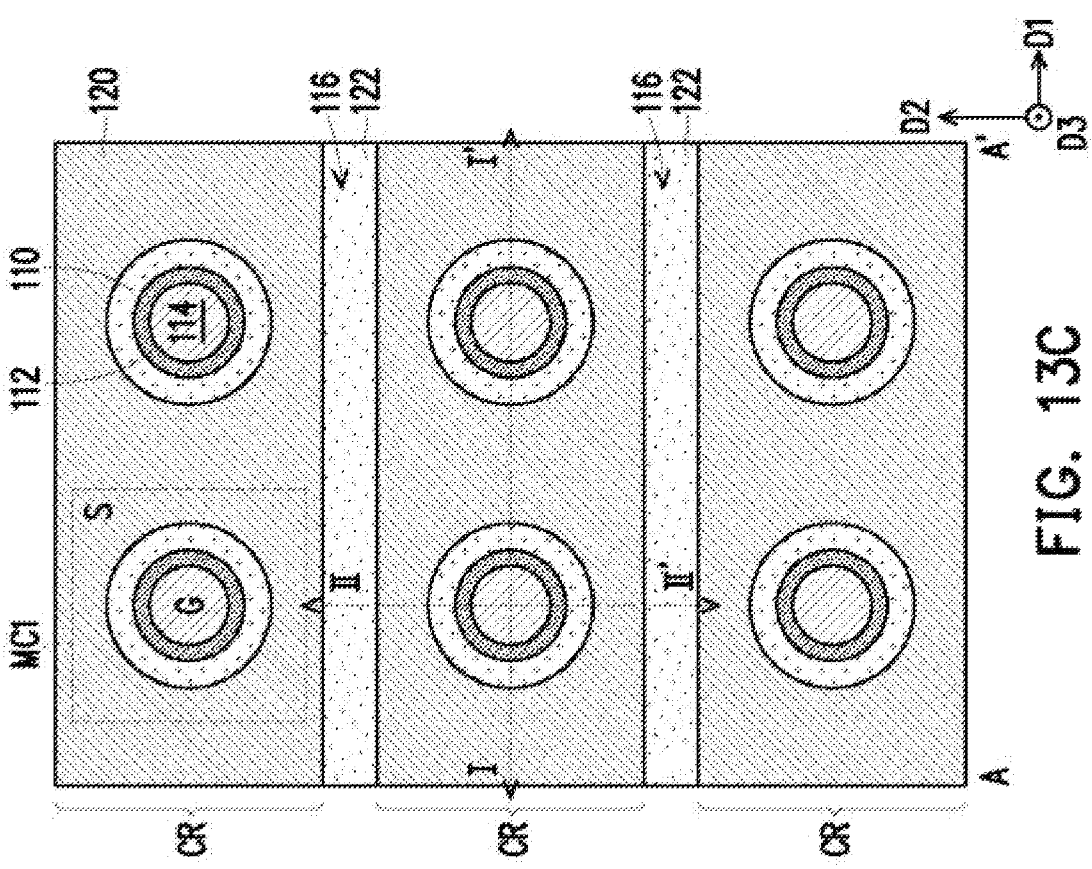
Figure 13E:
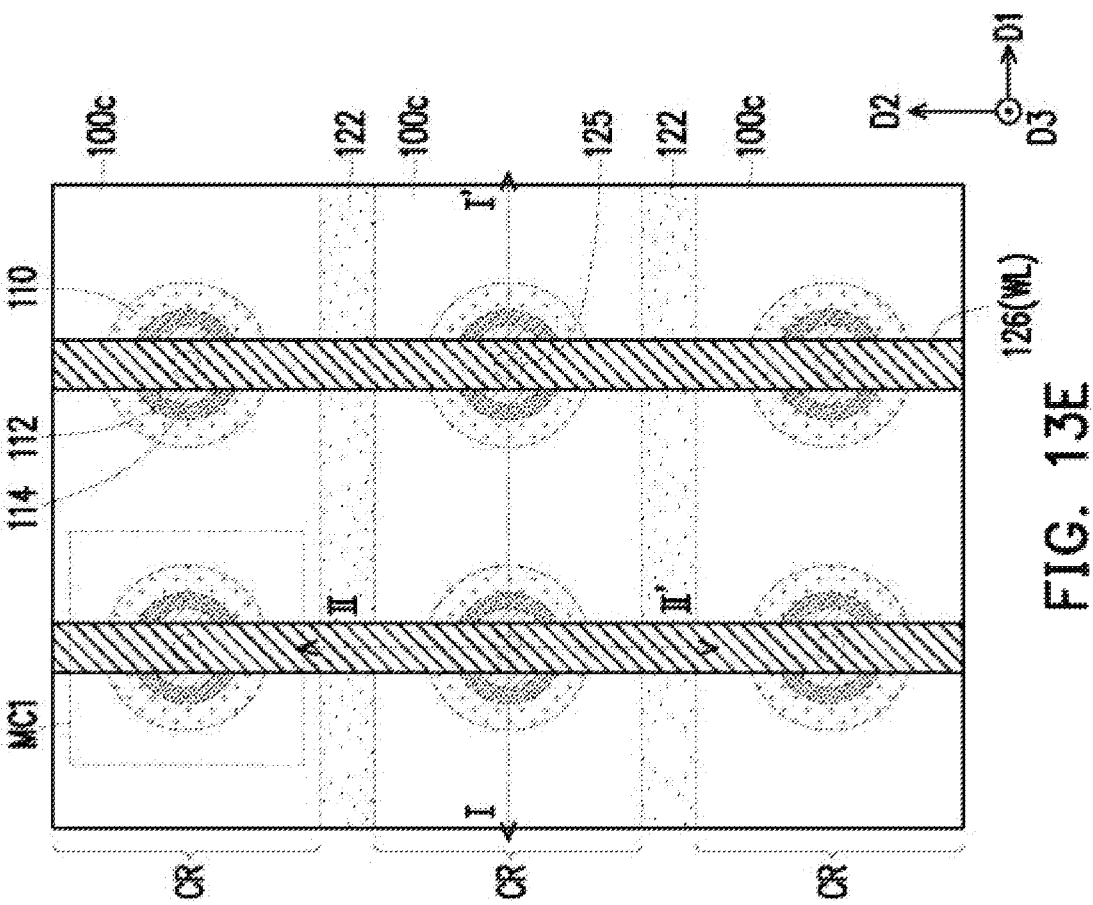

FIG. 13E illustrate a top view of FIG. 13A and FIG. 13B. Referring to FIGS. 13A, 13B and 13E, in some embodiments, the conductive lines 126 are formed to extend in parallel along the direction D2, and each of the conductive lines 126 is electrically connected to a plurality of conductive pillars 114 in different cell regions CR arranged in a same column along the direction D1. In some embodiments, the conductive lines 126 are electrically connected to the conductive pillars 114 through the conductive vias 125.

Referring to FIG. 1 and FIG. 13A to FIG. 13E, in some embodiments, a memory device 1000A including a memory array (or referred to as memory cell array) 500A is thus formed. Further processes (not shown) may be performed to form other layers on the memory array 500A to complete a fabrication of a semiconductor die. In some embodiments, the memory array 500A may be disposed in the back end of line (BEOL) of the semiconductor die. For example, the memory array 500A may be disposed in the interconnection structure 25 of the structure 50. In some embodiments, the memory array 500A may be disposed in a top conductive layer of the interconnection structure, such as above all other interconnector layers in the semiconductor die. In some other embodiments, the memory array 500A may be disposed in intermediate layers of the interconnection structure 25, and the semiconductor die may include, for example, additional interconnect layers above and below the memory array 500A. In some embodiments, the memory array 500A is electrically coupled to the logic circuit including the transistors of the structure 50 through a plurality of conductive vias and line (not shown) disposed in the interconnection structure 25 (FIG. 1).

In some embodiments, the memory array 500A includes a plurality of cell regions CR arranged along the direction D2 and separated from each other by isolation structures 122. The cell regions CR may each extend along the direction D1 and include a plurality of memory cells MC1 arranged along the direction D1. The direction D1 and the direction D2 may be substantially perpendicular to each other and parallel with the top surface of the substrate 10. In other words, the memory array 500A may at least include a plurality of memory cells MC1 arranged in an array including rows and columns. In some embodiments, in a same cell region CR, the memory cells MC1 are arranged in a row along the direction D1, and the memory cells MC1 in different cell regions CR may be aligned with each other along the direction D2 and may be arranged in columns. It is noted that the number of memory cells included in each cell region CR is not limited to that which is shown in the figures.

In some embodiments, the memory array 500A includes a stack structure ST1 including the dielectric layer 100*a*, the conductive layer 101, the dielectric layer 100*b*, the conductive layer 120, and the dielectric layer 100*c* stacked from bottom to top. The conductive pillars 114, the dielectric layer 112 and the channel layer 110 penetrate through and are laterally surrounded by the stack structure ST1. The data storage layer 108 is disposed between the conductive layer 101 and the channel layer 110. In some embodiments, a plurality of memory cells MC1 are included in each of the cell regions CR. The memory cells MC1 each include a transistor T1 constituted by a corresponding one of the pillar structures 115, the channel layer 110, a portion of the conductive layer 120 surrounding the corresponding pillar structure, and a portion of the conductive layer 101 surrounding the corresponding pillar structure. In some embodiments, a corresponding one of the conductive pillar 114 serves as a gate electrode G of the transistor T1 and may also be referred to as a gate pillar. The dielectric layer 112 serves as a gate dielectric layer of the transistor T1. The corresponding pillar structure may also be referred to as a gate pillar structure. The channel layer 110 serves as a channel of the transistor T1. The portion of the conductive layer 120 serve as a source electrode S of the transistor T1, and the portion of the conductive layer 101 serves as a drain electrode D of the transistor T1. In other words, the transistor T1 includes a gate pillar (e.g., a corresponding one of the conductive pillars 114), a portion of the gate dielectric layer 112, a portion of the channel layer 110, a drain electrode D (e.g., a portion of the conductive layer 101), and a source electrode S (e.g., a portion of the conductive layer 120).

The memory cells MC1 further include corresponding data storage structures DS1 coupled to (e.g., the drain side of) the corresponding transistors T1. A data storage structure DS1 includes a portion of the data storage layer 108 and electrodes disposed on opposite sides of the data storage layer 108. In some embodiments, a portion of the conductive layer 101 serves as one of the electrodes (e.g., a first electrode of the data storage structure DS1), and a portion of the channel layer 110 may serve as the other one of the electrodes (e.g., a second electrode of the data storage structure DS1). In other words, the drain electrode D of the transistor T1 and the first electrode of the data storage structure DS1 may share a common conductive layer 101, while the channel of the transistor T1 and the second electrode of the data storage structure DS1 may share a common layer (e.g., the channel layer 110 (such as a semiconductor oxide, or a metal oxide layer)). In some embodiments, a portion of the conductive layer 101 serves as both the drain electrode D of the transistor T1 and the first electrode of the data storage structure DS1, and a portion of the channel layer 110 serves as both a channel region of the transistor T1 and the second electrode of the data storage structure DS1.

In some embodiments, the conductive layer 101, the conductive layer 120, and the conductive layer 126 serve as a bit line BL, a source line SL, and a word line (WL) of the memory array 500A, respectively. The bit line BL and the source line SL are parallel extending along the direction D1 and are vertically separated from each other by the dielectric layer 100*b*. The word line WL is disposed over the source line SL and the bit line BL and further extends in the direction D2 perpendicular to the direction D1. In some embodiments, the bit line BL electrically connects the drain electrodes D of memory cells MC1 arranged in the direction D1 within a same cell region CR; the source line SL electrically connects the source electrodes S of memory cells MC1 arranged in the direction D1 within a same cell region CR; and the word line WL electrically connects the gate electrodes G of memory cells MC1 that are located in different cell regions CR and are arranged in a same column along the direction D2.

Still referring to FIG. 13A to FIG. 13E, in the embodiments of the disclosure, each of the gate pillar structures 115 extends in the direction D3, vertically penetrates through the stack structure ST1 including the source line SL and bit line BL, and is laterally surrounded by the source electrode S/source line SL (e.g., the conductive layer 120) and the drain electrode D/bit line BL (e.g., the conductive layer 101). The channel layer 110 penetrates through the stack structure ST1, laterally wrapping around each of the gate pillar structures 115 and is laterally sandwiched between the gate pillar structure and the stack structure ST1. The channel layer 110 vertically extends in the direction D3 and may also be referred to as a vertical channel. In some embodiments, the channel layer 110 is in physical contact with source electrode S/source line SL (e.g., the conductive layer 120), and is laterally spaced from the drain electrode D/bit line BL (e.g., the conductive layer 101) by the data storage layer 108. The data storage layer 108 is embedded in the stack structure ST1 and is laterally surrounds the channel layer 110 and the gate pillar structures 115. In some embodiments, the data storage layer 108 is in physical contact with the channel layer 110 and is laterally surrounded by the drain electrode D/bit line BL (i.e., the conductive layer 101).

Still referring to FIG. 13A to FIG. 13D, in some embodiments, the gate dielectric layer 112 includes a dielectric material, such as silicon oxide, and the data storage layer 108 may be a phase change material and may also be referred to as a phase change memory (PCM) layer. In such embodiments, the memory cells MC1 may also be referred to as PCM cells or phase change random access memory (PCRAM) cells, and the memory device 1000A is a PCRAM device. A PCRAM cell has a one transistor one resistor (1T1R) configuration. The one transistor refers to the transistor T1, and the data storage structure DS1 is the one resistor that is constituted by the PCM layer 108 and the two electrodes (e.g., a portion of the conductive layer 101 and a portion of the channel layer 110) disposed on opposite sides of the PCM layer 108.

In some embodiments, the phase change material may, for example, be or include chalcogenide materials, which include at least one chalcogen ion (e.g., a chemical element in column VI of the period table), sulfur (S), selenium (Se), tellurium (Te), selenium sulfide (SeS), germanium antimony tellurium (GeSbTe), silver indium antimony tellurium (AgInSbTe), or the like. In some embodiments, the PCM layer 108 may, for example, be or include a germanium tellurium compound (GeTeX), an arsenic tellurium compound (AsTeX), or an arsenic selenium compound (AsSeX), where X may, for example, be or include elements like germanium (Ge), silicon (Si), gallium (Ga), lanthanide (In), phosphorus (P), boron (B), carbon (C), nitrogen (N), oxygen (O), a combination of the foregoing, or the like.

In some embodiments, the PCM layer 108 has variable phases each representing a data bit. For example, the PCM layer 108 has a crystalline phase and an amorphous phase which are interchangeable under different conditions. The crystalline phase and the amorphous phase may respectively represent a binary "1" and a binary "0", or vice versa. Accordingly, the PCM layer 108 has different resistances corresponding to different phases. For example, the PCM layer 108 has a relatively high resistance in an amorphous phase, which may be used to represent that data stored in a PCM cell MC1 is a binary "0", and the PCM layer 108 has a relatively low resistance in a crystalline phase, which may be used to represent that data stored in the PCM cell MC1 is a binary "1". In some embodiments, by providing suitable bias conditions, the PCM layer 108 may be switched between different states of electrical resistances (e.g., a first state with low resistance and a second state with a high resistance) to store data.

During the operation of a PCM cell MC1, the data state of the PCM cell MC1 may be set and reset by switching the phase of the PCM layer 108. In some embodiments, during the operation, the PCM layer 108 varies between the amorphous state (e.g., high resistance) and the crystalline phase (e.g., low resistance) depending upon a voltage applied across the PCM layer 108. For example, during the operation (e.g., set or reset), a first voltage Vg is applied to the gate electrode G, and a second voltage Vd is applied to the drain electrode D, while the source electrode is grounded (e.g., the voltage Vs applied to source electrode S is 0), thereby creating an electric current (or referred to as writing current) flowing through the PCM layer 108. In some embodiments, as shown in FIG. 13A, the writing current path CP1 during the operation of PCM cell MC1 may flow from the drain electrode D, then flow through the PCM layer 108 and the channel layer 110, and flow to the source electrode S.

In some embodiments, during the set operation, the PCM layer 108 may be switched to the crystalline phase by heating the PCM layer 108 to a relatively low temperature (e.g., higher than crystallization point of the PCM layer 108 but lower than the melting point of the PCM layer 108) using Joule heating resulting from an electric current CP1 flowing through the PCM layer 108. The electric current flowing through the PCM layer 108 in the set operation may also be referred to as a set current $I_{set}$. During the reset operation, the PCM layer 108 may be switched to the amorphous phase by heating the PCM layer 108 to a relatively high temperature (e.g., higher than the melting point of the PCM layer 108) using Joule heating resulting from another electric current flowing through the PCM layer 108. The electric current flowing through the PCM layer 108 in the reset operation may also be referred to as a reset current $I_{reset}$.

Figure 14A:
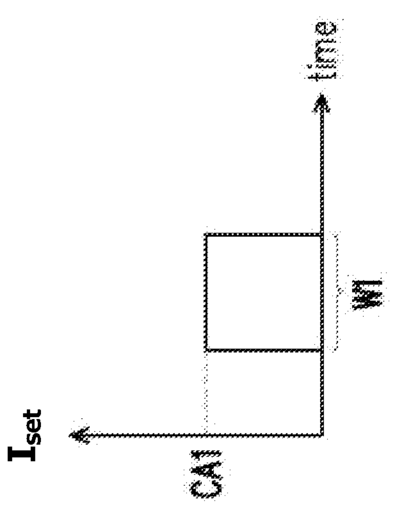
FIG. 14A to FIG. 14C are graphs respectively illustrating current amplitude versus time during a set operation of a phase-change random access memory (PCRAM) device according to some embodiments of the disclosure.
Figure 14B:
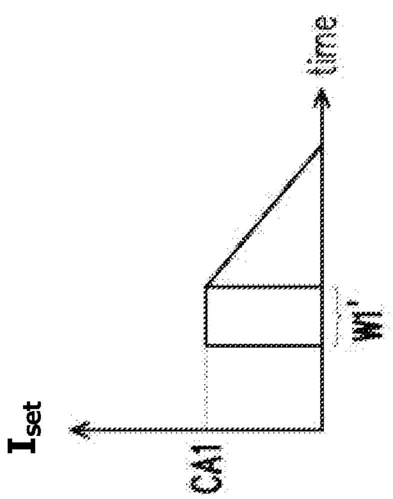
Figure 14C:
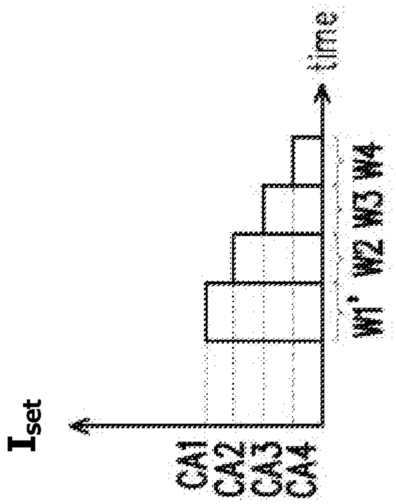
Figure 14D:
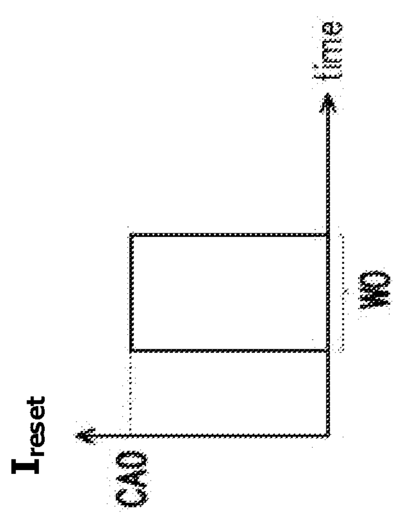
FIG. 14D is a graph illustrating current amplitude versus time during a reset operation of a PCRAM device according to some embodiments of the disclosure.

FIG. 14A to FIG. 14C are graphs respectively illustrating current amplitude versus time during set operation of PCM cell, and FIG. 14D is a graph illustrating current amplitude versus time during reset operation of PCM cell.

Referring to FIG. 14A to FIG. 14D, in some embodiments, the set current Let has a lower current amplitude and a longer time (e.g., overall pulse width) than those of the reset current $I_{reset}$. As such, the PCM layer 108 is heated by a relatively low temperature resulting from the relatively lower set current Let for a relatively long time, to facilitate the crystallization of the PCM layer 108 during set operation, while the PCM layer 108 may be heated by a relatively high temperature resulting from the relatively high reset current $I_{reset}$ for a relatively short time, to be switched to an amorphous state, during the reset operation. For example, as shown in FIG. 14A and FIG. 14D, the current amplitude CA1 of set current $I_{set}$ is lower than the current amplitude CA0 of the reset current $I_{reset}$, and the pulse width W1 of the set current $I_{set}$ may be larger than the pulse width W0 of the reset current $I_{reset}$. In some embodiments, the pulse width W1 of the set current $I_{set}$ may range from 100 ns to 200 ns, while the pulse width W0 of the reset current $I_{reset}$ may be less than 20 ns, for example.

In some embodiments, during the set operation, the set current $I_{set}$ may have a constant current amplitude CA1, as shown in FIG. 14A. Alternatively, the set current $I_{set}$ may have a variable current amplitude. For example, the set current $I_{set}$ may have a first current amplitude CA1 with a first pulse width W1', and the current amplitude is then gradually decreased from the first current amplitude CA1, until the current amplitude is decreased to zero, as shown in FIG. 14B. In some other embodiments, the set current $I_{set}$ may have various current amplitudes each with a pulse width. For example, as shown in FIG. 14C, the set current $I_{set}$ may have a first current amplitude CA1 with a first pulse width W1', a second current amplitude CA2 with a second pulse width W2, a third current amplitude CA3 with a third pulse width W3, a fourth current amplitude CA4 with a fourth pulse width W4 and so on. The current amplitudes may be decreased sequentially from the first current amplitude CA1 to the fourth current amplitude CA4. Although four different current amplitudes are used in FIG. 14C, more or less current amplitudes may be applied for the set current $I_{set}$.

Referring back to FIG. 13A to FIG. 13D, in some other embodiments, the gate dielectric layer 112 include a dielectric material such as silicon oxide, silicon nitride, silicon oxynitride, the like, or combinations thereof. The data storage layer 108 may include a dielectric material having variable resistances. For example, the variable resistance layer 108 may include a metal oxide such as $HfO_2$, or an oxidized metal such as $WO_x$, $HfO_x$, $AlO_x$, or the like, or combinations thereof. In such embodiments, the data storage layer 108 may also be referred to as a variable resistance layer. The memory cells MC1 are resistive random access memory (RRAM) cells, and the memory device 1000A may also be referred to as a RRAM device.

In such embodiments, each of the memory cells MC1 has a one transistor one resistor (1T1R) configuration, in which the one transistor refers to the transistor T1, and the data storage structure DS1 is the one resistor comprising the variable resistance layer 108 and two electrodes (e.g., a portion of the conductive layer 101 and a portion of the channel layer 110) disposed on opposite sides of the variable resistance layer 108.

In some embodiments, the variable resistance layer 108 may be switched between multiple resistivity states (e.g., a high resistivity state and a low resistivity state) upon different voltages applied across the variable resistance layer 108. The mechanism by which this resistance switching occurs has to do with selectively conductive filaments which are arranged within the variable resistance layer 108. In some embodiments, during the forming operation, a specific voltage (e.g., a forming voltage) is applied across the variable resistance layer 108 to initially form conductive filaments in the variable resistance layer 108. This forming voltage produces a high electric field and induces formation of localized oxygen vacancies in the variable resistance layer 108. These localized oxygen vacancies tend to align to form conductive filaments which may extend between the electrodes (e.g., a portion of the conductive layer 101 and a portion of the channel layer 110) on opposite sides of the variable resistance layer 108. After the forming operation, the variable resistance layer 108 has a relatively low resistivity. In some embodiments, the forming voltage is usually a different voltage from the voltage used to set or reset the memory cells and is usually at a higher value. During the write (e.g., set or reset) operation, depending on an applied voltage, the variable resistance dielectric layer 108 will undergo a reversible change between a high resistance state associated with a first data state (e.g., a binary "0") and a low resistance state associated with a second data state (e.g., a binary "1"), or vice versa.

During a set operation, the set voltage applied across the variable resistance layer 108 may have a different polarity from the forming voltage. For example, a first voltage is applied to the gate electrode G, a second voltage is applied to the drain electrode D, and the source electrode is grounded, thereby dissociating the conductive filaments in the variable resistance layer 108 and thus increasing the resistance of the variable resistance layer 108. In other words, the variable resistance layer 108 may be set to be in a high resistance state corresponding to a first data state (e.g., a binary "0"). In some embodiments, during the set operation, the current flows from the drain electrode D, through the variable resistance layer 108 and the channel layer 110, and flows to the source electrode S, as shown as the current path CP1.

During a reset operation, the voltage is reversed and applied across the variable resistance layer 108. That is, the reset voltage applied across the variable resistance layer 108 has a different polarity from the set voltage. For example, a first voltage is applied to the gate electrode G, a second voltage is applied to the source electrode S, and the drain electrode D is grounded, thereby inducing the formation of conductive filaments (e.g., oxygen vacancies) in the variable resistance layer 108 and thus decreasing the resistance of the variable resistance layer 108. In other words, the variable resistance layer 108 is reset to be in a low resistance state corresponding to a second data state (e.g., "1"). In some embodiments, during the reset operation, the current flows from the source electrode S, through the channel layer 110 and the variable resistance layer 108, and flows to the drain electrode D, as shown as the current path CP2, which is reversed from the current path CP1.

Figure 15A:
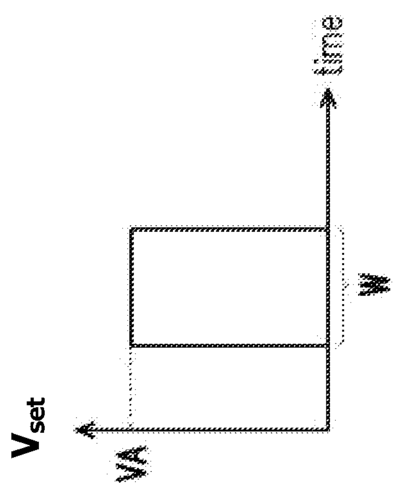
FIG. 15A is a graph illustrating voltage amplitude versus time during a set operation of a resistive random access memory (RRAM) device according to some embodiments of the disclosure.
Figure 15B:
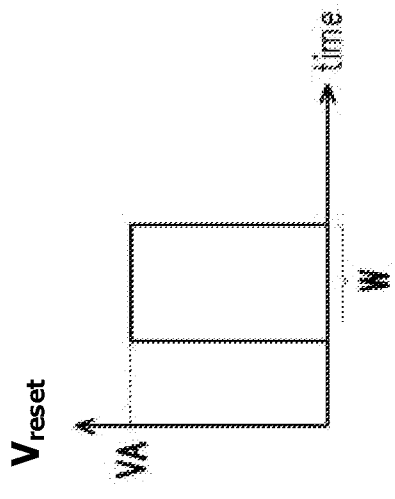
FIG. 15B is a graph illustrating voltage amplitude versus time during a reset operation of a resistive random access memory (RRAM) device according to some embodiments of the disclosure.

FIG. 15A and FIG. 15B are graphs illustrating voltage amplitude versus time during a set operation and a reset operation of the RRAM cell. As shown in FIG. 13A, FIG. 15A and FIG. 15B, in some embodiments, the voltage amplitude VA of set voltage $V_{set}$ applied across the variable resistance layer 108 may be substantially the same as the voltage amplitude VA of reset voltage $V_{reset}$ applied across the variable resistance layer 108. The pulse width W of the set voltage $V_{set}$ and the pulse width W of the reset voltage $V_{reset}$ may be substantially the same. In other words, during the set and reset operations, voltages applied across the variable resistance layer 108 have different polarities, and may have substantially the same voltage amplitude and pulse width. The variable resistance layer 108 may be set and reset by reversing the voltage applied thereacross. However, the disclosure is not limited thereto. In some other embodiments, besides of reversing the voltage applied across the variable resistance layer 108, the set voltage and the reset voltage may have different voltage amplitudes and/or different pulse widths.

Referring back to FIG. 13A to FIG. 13D, in some other embodiments in which the data storage layer 108 is a variable resistance layer, the gate dielectric layer 112 may include a ferroelectric material and may also be referred to as ferroelectric layer. The ferroelectric material may include hafnium oxide ($HfO_x$) doped with dopant(s) such as Zr, Si, La, hafnium zirconium oxide (HZO), AlScN, ZrOx, ZrOxPb3Ge5O11 (PGO), lead zirconatetitanate (PZT), $SrBi_2Ta_2O_9$ (SBT or SBTO), $SrB_4O_7$ (SBO), $Sr_aBi_bTa_cNb_dO_x$(SBTN), $SrTiO_3$ (STO), $BaTiO_3$ (BTO), $(Bi_xLa_y)Ti_3O_{12}$ (BLT), $LaNiO_3$ (LNO), $YMnO_3$, $ZrO_2$, zirconium silicate, ZrAlSiO, hafnium oxide ($HfO_2$), hafnium silicate, HfAlO, LaAlO, lanthanum oxide, $Ta_2O_5$, and/or other suitable ferroelectric material, or combinations thereof. However, the disclosure is not limited thereto.

In such embodiments, the ferroelectric layer 112 may be polarized in different polarization directions, and the polarization direction of the ferroelectric layer 112 may be changed by varying the voltage applied across the ferroelectric layer 112. The threshold voltage of the transistor T1 may vary as the polarization state of the ferroelectric layer 112 changes. For example, the ferroelectric layer 112 may be switched between a first polarization direction corresponding to a relatively high threshold voltage and a second polarization direction corresponding to a relatively low threshold voltage. The first polarization direction (e.g., high threshold voltage) and the second polarization direction (e.g., low threshold voltage) may respectively represent a first data state (e.g., "0") and a second data state (e.g., "1"), or vice versa.

In such embodiments, the transistor T1 is a ferroelectric field effect transistor (FeFET), which is one type of memory component. In other words, each of the memory cells MC1 includes two types of memory components within a single cell. The first type of memory component is the FeFET T1 used for controlling the threshold voltage of the memory cell MC1, and the second type of memory component is the RRAM including the data storage structure DS1 (e.g., resistor) used for controlling the resistance of the memory cell MC1. The two types of memory components may respectively store a first data state (e.g., "0") and a second data state (e.g., "1"). For example, the FeFET may store a first data state (e.g., "0") corresponding to a high threshold voltage state and a second data state (e.g., "1") corresponding to a low threshold voltage state, while the data storage structure DS1 may store a first data state (e.g., "0") corresponding to a high resistance state and a second data state (e.g., "1") corresponding to a low resistance state. Therefore, the memory cell MC1 including the FeFET and RRAM may store the following four data states: a first data state (e.g., "00") corresponding to a high threshold voltage state and a high resistance state, a second data state (e.g., "01") corresponding to a high threshold voltage state and a low resistance state, a third data state (e.g., "10") corresponding to a low threshold voltage state and a high resistance state, and a fourth data state (e.g., "11") corresponding to a low threshold voltage state and a low resistance state.

In some embodiments, the two types of memory components in the same memory cell may be operated (e.g., set) separately, and the operations of the two types of memory component do not affect each other.

During the operation (e.g., set or reset) of the FeFET, an operation voltage is applied on the gate electrode G, while the source electrode S and the drain electrode D are grounded. For example, during the set operation, a positive voltage is applied on the gate electrode G, while the source electrode S and the drain electrode D are grounded, thereby polarizing the ferroelectric layer 112 to a first polarization state. During the reset operation, a negative voltage is applied on the gate electrode G, while the source electrode S and the drain electrode D are grounded, thereby polarizing the ferroelectric layer 112 to a second polarization state. The operation of the RRAM is substantially the same as those described above.

During the operation of the FeFET, since the source electrode S and the drain electrode D are grounded, no current would flow through the variable resistance layer 108. Therefore, the operation of the FeFET won't affect the variable resistance layer 108 included in the data storage structure DS1 of RRAM. On the other hand, during the operation of RRAM, the voltage applied across the ferroelectric layer 112 is lower than the voltage applied across the ferroelectric layer 112 when the FeFET is operated. Therefore, during the operation of RRAM, the voltage applied across the ferroelectric layer 112 won't cause a change of polarization state in the ferroelectric layer 112 and thus won't affect the data state of the FeFET. For example, during the operation (e.g., set or reset) of the FeFET, the voltage applied on the gate electrode G ranges from 2V to 4V (or −2V to −4V), while the source electrode S and the drain electrode D are grounded. During the operation (e.g., set or reset) of the RRAM, a first voltage applied on the gate electrode G may range from 1V to 2V, and a second voltage applied on one of the source electrode S and the drain electrode D may range from 1V to 3V, while the other one of the source electrode S and the drain electrode D is grounded.

Although a combination of FeFET and RRAM is described above for illustration, the disclosure is not limited thereto, other combination of different memory components may also be applied in a single memory cell MC1. For example, in some other embodiments in which the memory cell includes two types of memory components, the gate dielectric layer 112 may be a ferroelectric layer, while the data storage layer 108 may be a PCM layer. As such, the memory cell MC1 includes a FeFET and a PCRAM within a single memory cell.

Still referring to FIG. 13A to FIG. 13D, in yet another embodiment, the data storage layer 108 includes a dielectric material, such as a high-k dielectric material. The high-k dielectric material may include $HfO_2$, $ZrO_2$, $Al_2O_3$, AlHfZrO, NbO, the like, or combinations thereof. In such embodiments, the data storage structure DS1 is a capacitor including the data storage layer 108 (e.g., high-k dielectric material) and electrodes (e.g., a portion of the conductive layer 101 and a portion of the channel layer 110) disposed on opposite sides of the data storage layer 108. Accordingly, the memory cell MC1 has one-transistor one-capacitor (1T1C) configuration and may also be referred to as a dynamic random access memory (DRAM) cell.

Figure 16:
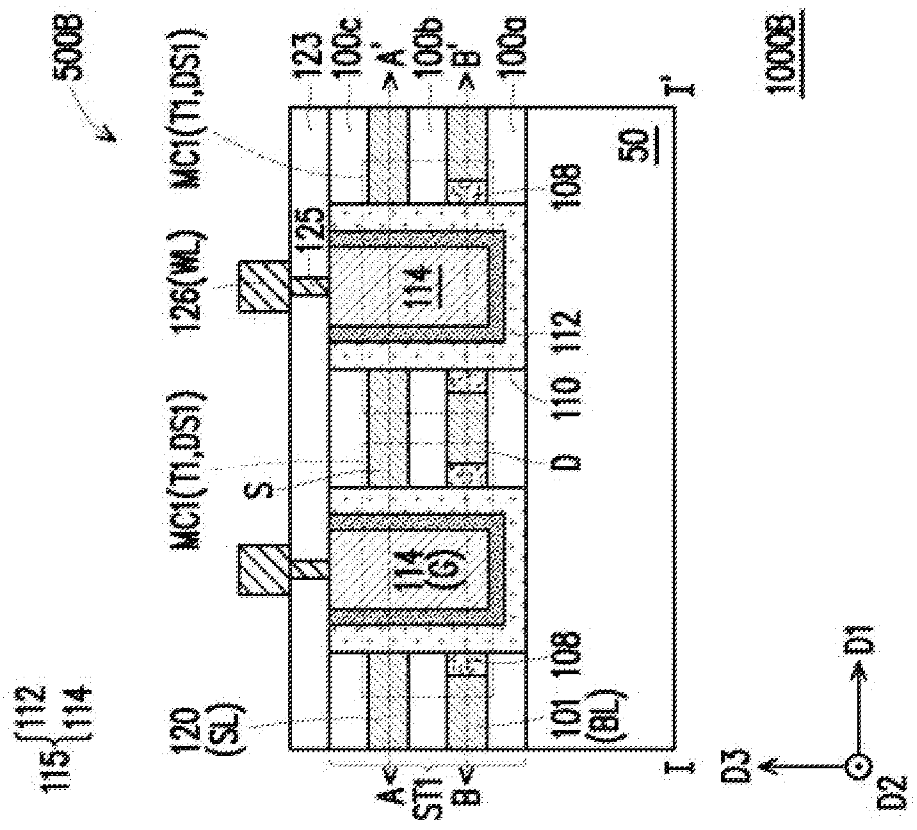
FIG. 16 is a cross-sectional view illustrating a memory device according to some embodiments of the disclosure.

FIG. 16 is a cross-sectional view illustrating a memory device 1000B including a memory array 500B according to some other embodiments of the disclosure. The memory device 1000B is similar to the memory device 1000A, except that the bottoms of the gate dielectric layer 112 and the channel layer 110 are not open, and the bottom surface of the gate pillar 114 is covered by the gate dielectric layer 112.

Referring to FIG. 16, in some embodiments, the cross-sectional views of the channel layer 110 and the gate dielectric layer 112 may be U-shaped, and the gate pillars 114 are disposed on and laterally surrounded by the channel layer 110 and the gate dielectric layer 112. In some embodiments, after the through holes 105 are formed in the stack structure ST as shown in FIG. 7A, a channel material, a dielectric material, and a conductive material are sequentially formed on the stack structure ST and filling into the through holes 105. Thereafter, a planarization process, such as CMP is performed to remove excess portions of the conductive material, the dielectric material and the channel material over the top surface of the stack structure ST.

Figure 17B:
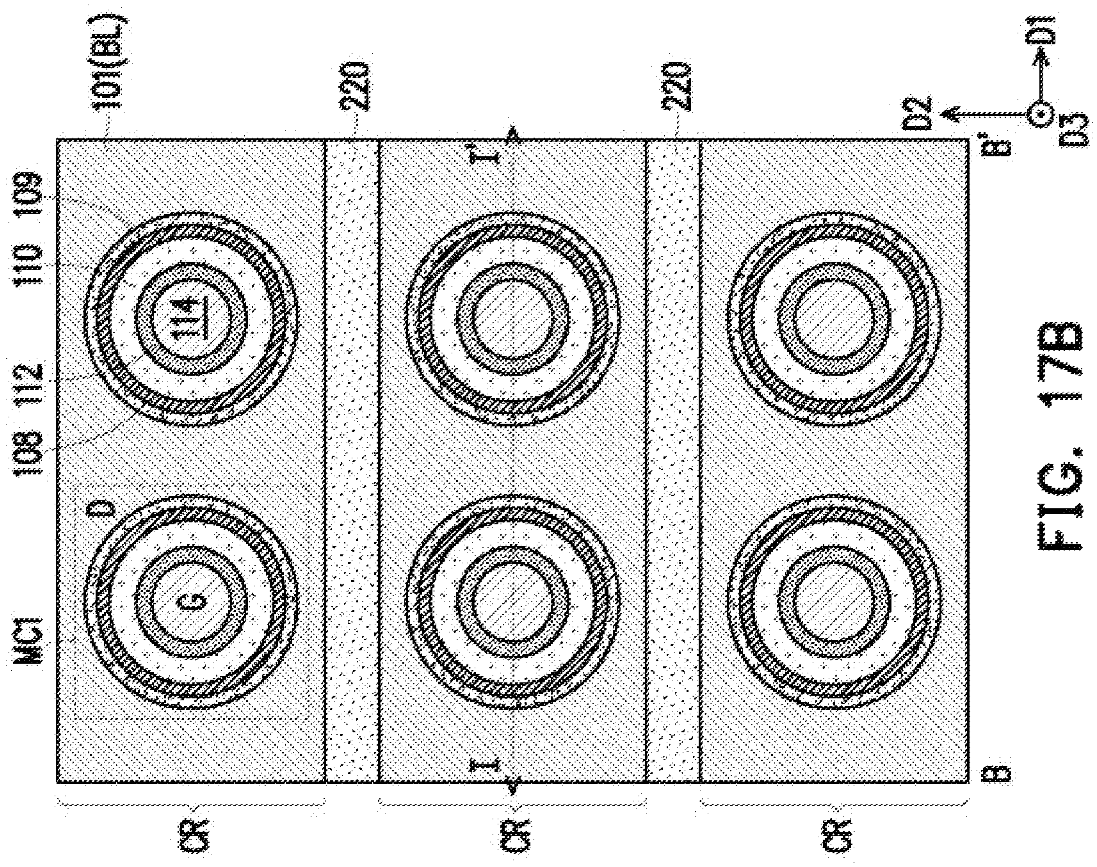
FIG. 17A and FIG. 17B illustrate a cross-sectional view and a plan view of a memory device according to some embodiments of the disclosure.
Figure 17A:
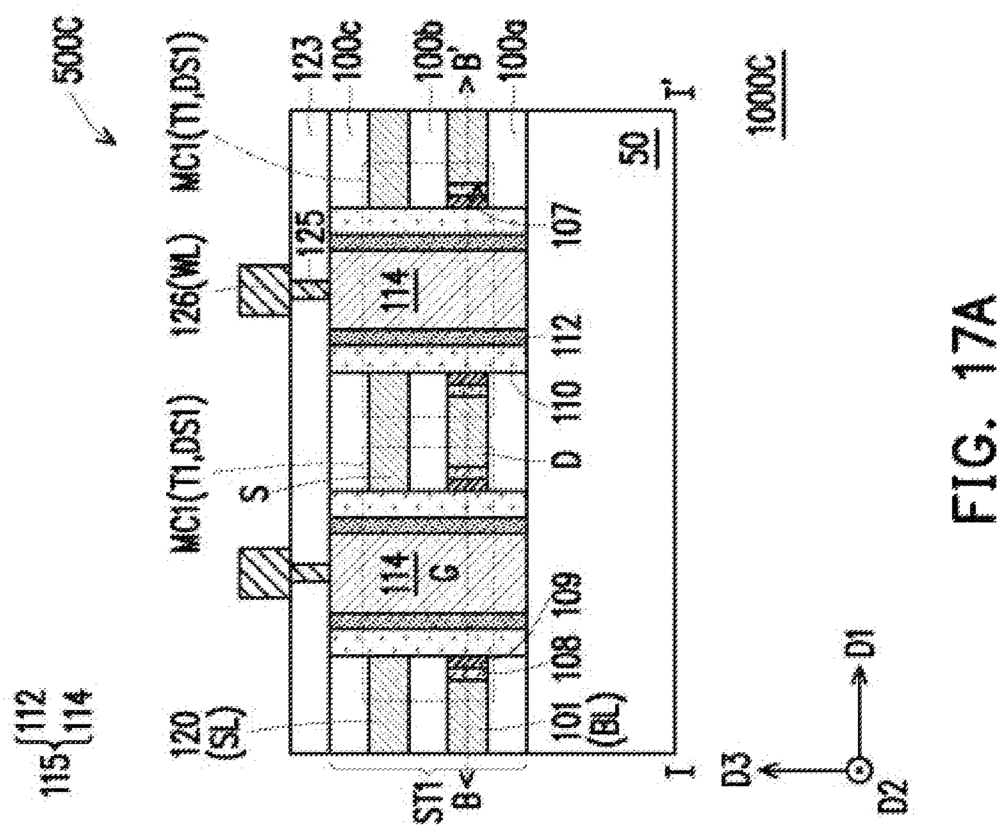

FIG. 17A and FIG. 17B illustrate a cross-sectional views and a plan view of a memory device 1000C including an memory array 500C according to some other embodiments of the disclosure. FIG. 17A is a cross-sectional view taken along line I-I' of FIG. 17B. FIG. 17B is a plan view along lines B-B' of FIG. 17A. The memory device 1000C is similar to the memory device 1000A, except that a conductive layer is further formed in the lateral recesses of the conductive layer 101 to serve as an electrode of the data storage structure DS1.

Referring to FIG. 17A and FIG. 17B, in some embodiments, a data storage layer 108 and a conductive layer 109 are formed within the lateral recesses 107 of the conductive layer 101. Referring to FIG. 6 and FIG. 7A, in some embodiments, after the data storage material layer 108' is formed, an etching process is performed to remove the data storage material layer 108' outside the recesses 107. In some embodiments, the etching process may further laterally etch a portion of the data storage material layer 108' within the recesses 107, thereby forming a data storage layer 108 that does not fill up the recesses 107. In other words, the recesses 107 are partially filled by the data storage layer 108. In some embodiments, the conductive layer 109 is further formed to fill the remaining portions of the recesses 107 that are not filled by the data storage layer 108.

The forming process of the conductive layer 109 may be similar to that of the data storage layer 108. For example, after the data storage layer 108 partially filling the recesses 107 is formed, a conductive material is formed along the top surface of the stack structure ST, the surfaces of the through holes 105 and filling the remaining portions of the recesses 107 by a suitable deposition process, such as ALD, CVD, or the like, or combinations thereof. The conductive material may be selected from the same candidate materials of the conductive layer 101. Thereafter, an etching process is performed to remove the conductive material outside the recesses 107 while the conductive layer 109 remains within the recesses 107. The etching process may include a wet etching, a dry etching, or combinations thereof.

Still referring to FIG. 17A and FIG. 17B, the data storage layer 108 is laterally sandwiched between the conductive layer 101 and the conductive layer 109, and the channel layer 110 is laterally spaced from the data storage layer 108 by the conductive layer 109 therebetween. The conductive layer 109 is vertically sandwiched between the dielectric layers **100*a* and 100*b*, and laterally sandwiched between the data storage layer 108 and the channel layer 110. The sidewalls of the conductive layer 109 may be substantially aligned with the sidewalls of the stacked structure ST1 and in contact with the channel layer 110. In some embodiments, a portion of the conductive layer 101 serves as one of the electrodes (e.g., first electrode) of the data storage structure DS1, and the conductive layer 109 functions as the other one of the electrodes (e.g., second electrode) of the data storage structure DS1. In other words, within a memory cell MC1, the drain electrode D of the transistor T1 and the first electrode of the data storage structure DS1 share the common conductive layer 101. The second electrode (i.e. the conductive layer 109) of the data storage structure DS1 is disposed on the other side of the data storage layer 108** opposite to the first electrode.

In some embodiments, the cross-sectional shapes of the data storage layer 108 and the conductive layer 109 may be rectangular, square, or the like. The heights of the data storage layer 108 and the conductive layer 109 are substantially equal to each other. Herein, the heights of the data storage layer 108 and the conductive layer 109 refer to the distances from the top surface to the bottom surface thereof, respectively. In some embodiments, the top surface of the data storage layer 108 and the top surface of the conductive layer 109 are substantially coplanar with each other and in contact with the bottom surface of the dielectric layer **100*b*, and the bottom surface of the data storage layer 108 and the bottom surface of the conductive layer 109 are substantially coplanar with each other and in contact with the top surface of the dielectric layer 100*a*. When viewed in the plan view FIG. 17B, the data storage layer 108 and the conductive layer 109 are ring-shaped and laterally surround the gate structure 115 and the channel layer 110**.

Figure 18:
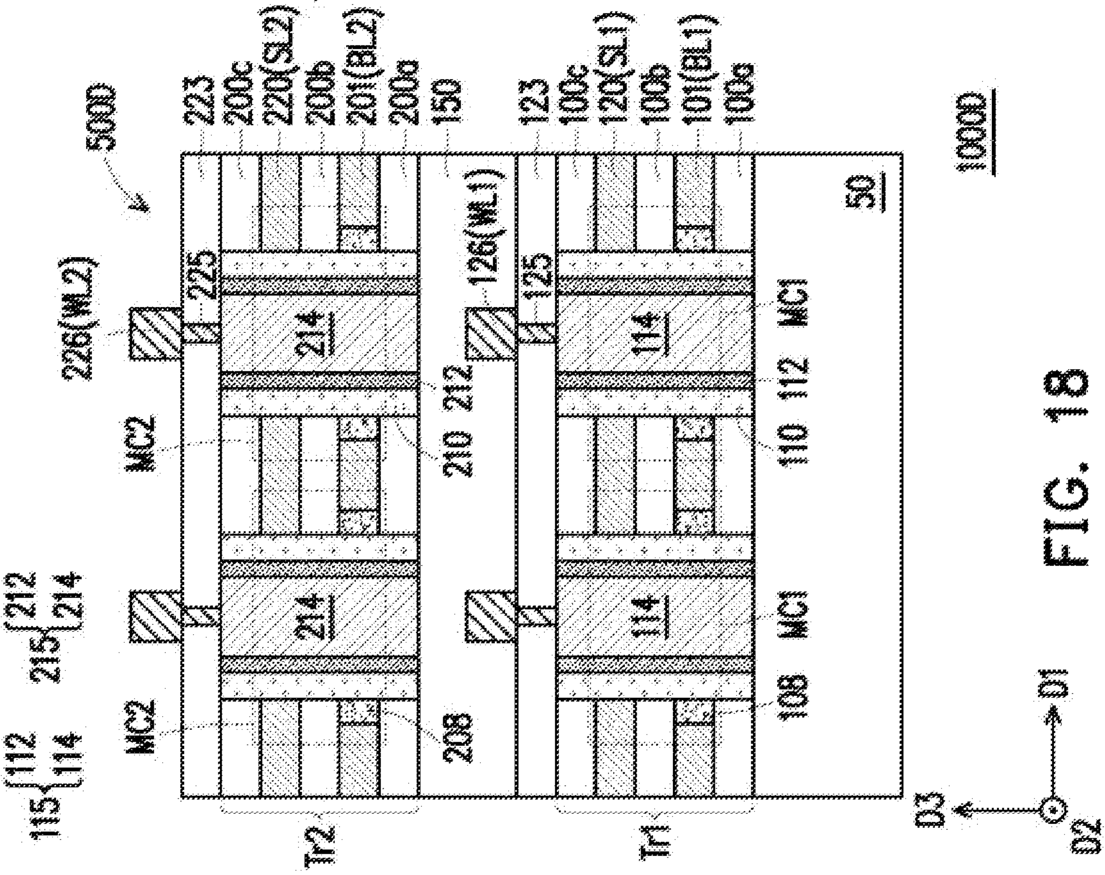

FIG. 18 is a cross-sectional view illustrating a memory device 1000D including a memory array 500D according to some other embodiments of the disclosure. The memory device 1000D is similar to the memory device 1000A, except that, the memory array 500D of the memory device 1000D includes more than one tier of memory cells.

For example, the memory array 500D is a three dimensional (3D) memory array including a first tier Tr1 of memory cells and a second tier Tr2 of memory cells stacked on the first tier Tr1. Each tier of the memory array 500D includes a plurality of memory cells arranged in an array including rows and columns. The structure of the second tier Tr2 is similar to that of the first tier Tr1 described above. It is noted that some components in the second tier Tr2 may be denoted with like-numbers in the first tier Tr1, plus number 1 or 100. For example, a memory cell in first tier Tr1 is denoted as MC1, while a memory cell in second tier Tr2 is denoted as MC2; the dielectric layers in first tier Tr1 are denoted as 100a-100c, while the dielectric layers in the second tier Tr2 are denoted as 200a-200c, and so on. The properties, materials and forming methods of the components in the second tier Tr2 may thus be found in the discussion referring to FIG. 1 to FIG. 13 by referring to the features having the corresponding reference numbers in the first tier Tr1.

In some embodiments, the first tier Tr1 of the memory array 500D may include a plurality of memory cells MC1 arranged in an array. The second tier Tr2 of the memory array 500D may include a plurality of memory cells MC2 arranged in an array. In some embodiments, after the first tier Tr1 of memory array is formed, a dielectric layer 150 is formed on the first tier Tr1 of memory array and covers the word lines WL. The dielectric layer 150 includes a suitable dielectric material such as silicon oxide, silicon nitride, silicon oxynitride, or the like, and may be formed by deposition such as CVD. Thereafter, processes described in FIG. 1 to FIG. 13 with respect to formation of the first tier Tr1 are repeated to the form the second tier Tr2 of the memory array on the first tier Tr1. It is noted that, the number of tiers of the memory array and the number of memory cells included in each tier shown in the figures are merely for illustration, and the disclosure is not limited thereto. In some other embodiments, more than two tiers of memory array may be included in the memory device.

Referring to FIG. 18, in some embodiments, the memory cells MC2 at the second tier Tr2 are overlapped with and may be substantially aligned or staggered with the corresponding memory cells MC1 at the first tier Tr1 in the direction D3, respectively. In some embodiments, the top surface and sidewalls of the word line WL1 are covered by the dielectric layer 150. As such, the word lines WL1 are separated from the memory cells MC2 (e.g., gate pillars 214) in the second tier Tr2 by a portion of the dielectric layer 150 disposed therebetween. In such embodiments, at the first tier Tr1, the word line WL1 connects the gate electrodes 114 of memory cells MC1 arranged in a same column along the direction D2; and at the second tier Tr2, the word line WL2 connects the gate electrode 214 of memory cells MC2 arranged in a same column along the direction D2. In other words, a word line connects to the gate electrode of corresponding memory cells disposed in a same tier, and gate electrodes in different tiers are connected to different word lines. However, the disclosure is not limited thereto.

Figure 19:
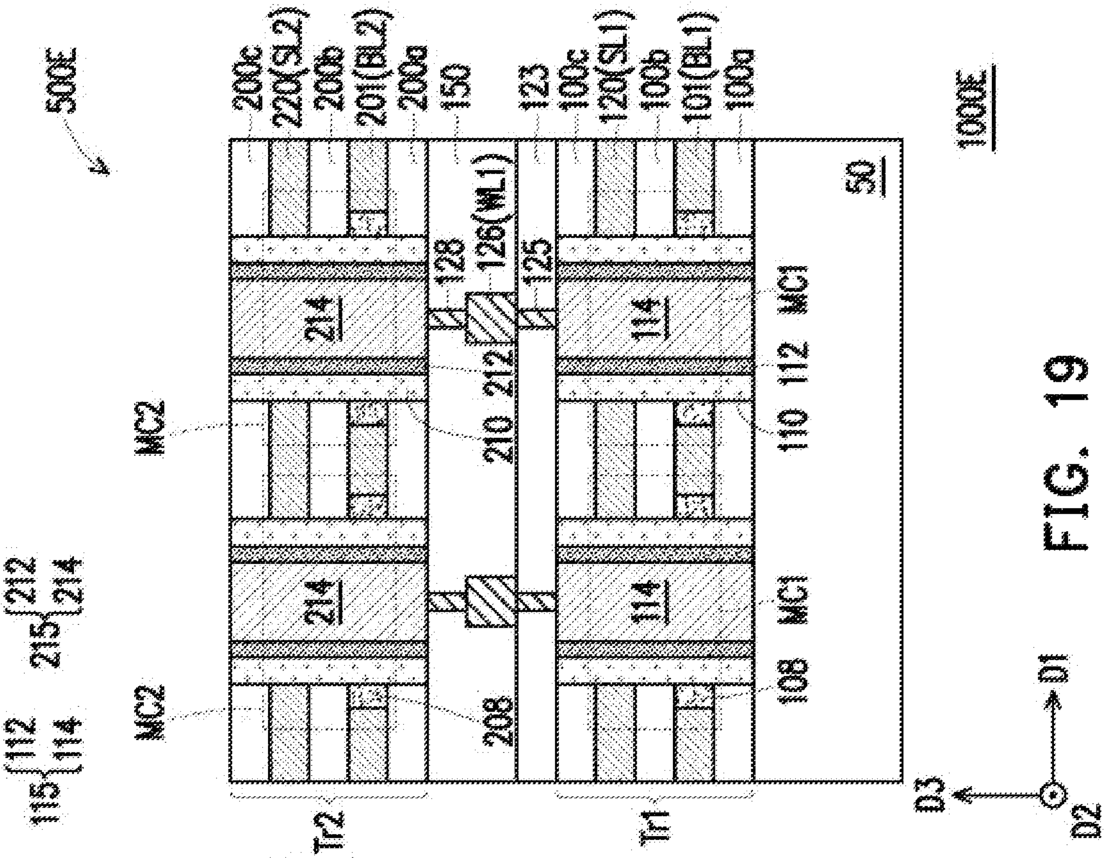
FIGS. 18-20 are cross-sectional views illustrating memory devices according to some embodiments of the disclosure.

FIG. 19 is a cross-sectional view illustrating a memory device 1000E including a memory array 500E according to some other embodiments of the disclosure. The memory device 1000E is similar to the memory device 1000D, except that word lines connect the gate electrodes of memory cells disposed in different tiers.

Referring to FIG. 19, in some embodiments, conductive vias 128 are further formed in the dielectric layer 150 and electrically connect the gate electrode 214 of memory cells in second tier Tr2 to the word lines WL1. The memory cells MC1 at the first tier Tr1 and the memory cells MC2 at the second tier Tr2 may be substantially aligned with each other in the direction D3. The word lines WL1 extend in the direction D2 and across a plurality of memory cells MC1 in different cell regions and a plurality of memory cells MC2 in different regions. In some embodiments, each word line WL1 is electrically connected to the gate electrodes 114 of memory cells MC1 at the first tier Tr1 arranged in a same column along the direction D2 through the conductive vias 125, and is electrically connected to the gate electrodes 214 of the memory cells MC2 at the second tier Tr2 arranged in a same column along the direction D2 through the conductive vias 128. The position relation between the word line WL1 and the memory cells MC2 are similar to the position relation between the word line WL1 and the memory cell MC1 (as shown in FIG. 13E), except that the memory cells MC2 are disposed over the word line WL1.

In other words, some of the memory cells MC2 at the second tier Tr2 and some of the memory cells MC1 at the first tier Tr1 are aligned with each other and share a common word line WL1. The word line WL1 may be disposed vertically between the corresponding memory cells MC1 and MC2. Conductive vias 125 are disposed between the gate electrodes 114 of the corresponding memory cells MC1 and the word line WL1 to provide electrical connection therebetween. Conductive vias 128 are disposed between the gate electrodes 214 of the corresponding memory cells MC2 and the word line WL1 to provide electrical connection therebetween.

In such embodiments, since the conductive lines 126 (e.g., the common word lines WL1) are shared by the memory cells MC1 and MC2, the conductive lines 226 disposed over the memory cells MC2 shown in FIG. 18 may be omitted. In some embodiments, more dielectric layers and conductive features (e.g., conductive vias or lines) and/or more tiers of memory cells (not shown) may be stacked over the second tier Tr2, and gate pillars of memory cells in upper tiers over the second tier Tr2 may be electrically connected to the gate pillars 214 of the memory cells MC2 through the conductive features disposed therebetween, and further electrically connected to the word lines WL1 through the gate pillars 214. Alternatively, the memory cells in upper tiers over the second tier Tr2 may use separate word lines.

Figure 20:
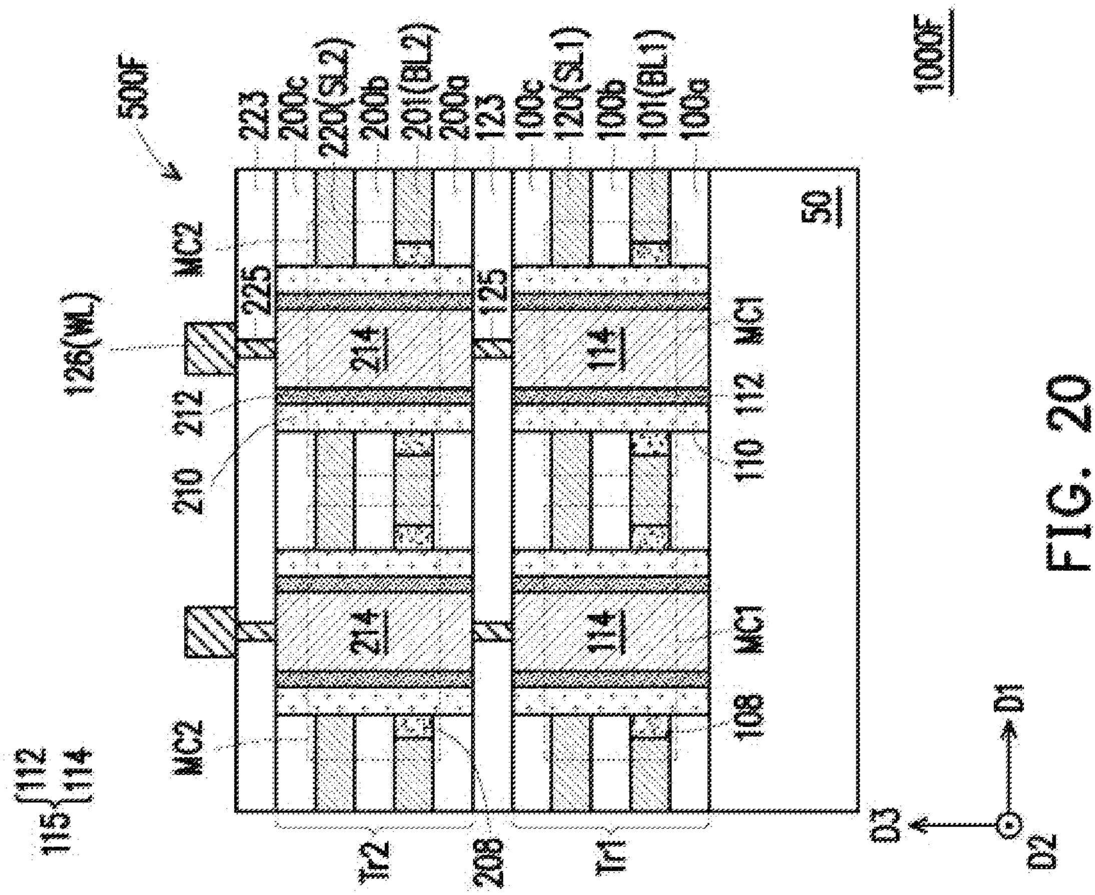

FIG. 20 is a cross-sectional view illustrating a memory device 1000F including a memory array 500F according to some other embodiments of disclosure. The memory device 1000F is similar to the memory device 1000E, except that, the common word line is disposed over the upper tier of memory stack.

Referring to FIG. 20, in some embodiments in which the memory cells MC1 in the first tier Tr1 and the memory cells MC2 in the second tier Tr2 share a common word line, the word line WL may be disposed over the second tier Tr2. For example, conductive vias 125 are embedded in the dielectric layer 123 between the first tier Tr1 and the second tier Tr2 and electrically connected to the gate pillars 114 and the gate pillars 214. Conductive lines 126 (e.g., word lines WL) are disposed over the gate pillars 214 and electrically connected to the gate pillars 214 through the conductive vias 225 disposed therebetween.

In the embodiments of the disclosure, the memory device is embedded in the back-end-of-line and includes vertical channel. As such, the footprint or memory size of the memory device may be reduced. Further, the memory device with vertical channel can be stackable in vertical direction to realize a 3D memory device, thereby increasing the memory density.

In accordance with some embodiments of the disclosure, a memory device includes a first memory cell disposed over a substrate. The first memory cell includes a transistor and a data storage structure coupled to the transistor. The transistor includes a gate pillar structure, a channel layer laterally wrapping around the gate pillar structure, a source electrode surrounding the channel layer, and a drain electrode surrounding the channel layer. The drain electrode is separated from the source electrode a dielectric layer therebetween. The data storage structure includes a data storage layer surrounding the channel layer and sandwiched between a first electrode and a second electrode. The drain electrode of the transistor and the first electrode of the data storage structure share a common conductive layer.

In accordance with some other embodiments of the disclosure, a memory device includes a first tier of a memory array disposed over a substrate. The first tier of the memory array includes a stack structure, a first gate pillar structure, a channel layer and a first data storage layer. The stack structure includes a first dielectric layer, a first conductive layer, a second dielectric layer, a second conductive layer, and a third dielectric layer stacked from bottom to top. The first gate pillar structure penetrates through and is laterally surrounded by the stack structure. The channel layer is disposed between the stack structure and the first gate pillar structure. The first data storage layer is disposed on the first dielectric layer and laterally between the first conductive layer and the channel layer.

In accordance with some embodiments of the disclosure, a method of forming a memory device includes: forming a first stack structure including a first dielectric layer, a first conductive layer, a second dielectric layer, a sacrificial layer, and a third dielectric layer stacked from bottom to top; patterning the first stack structure to form a through hole penetrating through the first stack structure; removing a portion of the first conductive layer exposed by the through hole to form a lateral recess defined by the first conductive layer, the first dielectric layer and the second dielectric layer; forming a data storage layer in the lateral recess; forming a first channel layer and a first gate pillar structure in the through hole; and replacing the sacrificial layer with a second conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a memory device, comprising:

forming a first stack structure including a first dielectric layer, a first conductive layer, a second dielectric layer, a sacrificial layer, and a third dielectric layer stacked from bottom to top;

patterning the first stack structure to form a through hole penetrating through the first stack structure;

removing a portion of the first conductive layer exposed by the through hole to form a lateral recess defined by the first conductive layer, the first dielectric layer, and the second dielectric layer;

forming a data storage layer in the lateral recess;

forming a first channel layer and a first gate pillar structure in the through hole; and replacing the sacrificial layer with a second conductive layer.

2. The method of claim 1, wherein forming the first channel layer and the first gate pillar structure comprises:

depositing a channel material on a top surface of the first stack structure and filling in the through hole;

etching horizontal portions of the channel material on the top surface of the first stack structure and at a bottom of the through hole, thereby forming the first channel layer on a sidewall of the through hole; and forming the first gate pillar structure in the through hole after the first channel layer is formed.

3. The method of claim 1, further comprising:

forming a fourth dielectric layer on the first stack structure and the first gate pillar structure;

forming a second stack structure on the fourth dielectric layer; and forming a second channel layer and a second gate pillar structure penetrating through the second stack structure, wherein a conductive via is formed in the fourth dielectric layer to electrically connect a second pillar of the second gate pillar structure to a first pillar of the first gate pillar structure.

4. The method of claim 1, wherein forming the data storage layer comprises:

depositing the data storage layer covering the first stack structure and lining the through hole; and removing portions of the data storage layer outside the lateral recess.

5. The method of claim 1, wherein the data storage layer has a concave sidewall in the lateral recess, wherein the concave sidewall faces the through hole.

6. The method according to claim 1, wherein the lateral recess extends in a closed path around the through hole.

7. The method of claim 1, further comprising:

forming a pair of trenches extending through the first stack structure and between which the first gate pillar structure is sandwiched, wherein the sacrificial layer is replaced through the trenches.

8. The method of claim 1, wherein the data storage layer comprises a high-k dielectric material.

9. A method of forming a memory device, comprising:

forming a first stack including a first dielectric layer, a first conductive layer over the first dielectric layer, a second dielectric layer over the first conductive layer, a sacrificial layer over the second dielectric layer, and a third dielectric layer over the sacrificial layer;

performing a first etch into the first stack to form a through hole extending through the first stack, wherein the first and second dielectric layers and the first conductive layer form a common sidewall in the through hole forming a data storage layer laterally recessed into the common sidewall at the first conductive layer, between the first and second dielectric layers;

forming a first channel layer and a first gate pillar in the through hole and individually extending from a bottom of the first stack to a top of the first stack; and replacing the sacrificial layer with a second conductive layer.

10. The method of claim 9, wherein the first etch forms a plurality of through holes, including the through hole, arranged in a row, and wherein the method further comprises:

performing a second etch into the first stack to form a pair of trenches extending through the first stack, wherein the row is sandwiched between the trenches, and wherein the replacing is performed through the trenches.

11. The method of claim 10, wherein the replacing comprises:

performing a third etch into the sacrificial layer through the trenches to remove the sacrificial layer and to form a cavity between the second and third dielectric layers; and depositing the second conductive layer into the cavity through the trenches.

12. The method of claim 9, wherein the data storage layer comprises a phase change material.

13. The method of claim 9, further comprising:

forming a ferroelectric layer in the through hole, between the first channel layer and the first gate pillar.

14. The method of claim 9, wherein the forming of the data storage layer comprises:

performing a second etch into the first conductive layer to expand a width of the through hole at the first conductive layer relative to a width of the through hole at the first and second dielectric layers.

15. The method of claim 9, wherein the first etch forms a pair of through holes, including the through hole, arranged in a column, and wherein the method further comprises:

performing a second etch into the first stack to form a trench extending through the first stack and separating the through holes from each other; and forming a conductive line and a conductive via overlying the through holes, wherein the conductive line extends in parallel with the column, and wherein the conductive via extends from the conductive line to the first gate pillar.

16. A method of forming a memory device, comprising:

forming a first stack including a first dielectric layer, a first conductive layer over the first dielectric layer, a second dielectric layer over the first conductive layer, a sacrificial layer over the second dielectric layer, and a third dielectric layer over the sacrificial layer;

performing a first etch into the first stack to form a plurality of through holes penetrating through the first stack, wherein the through holes are arranged in a plurality of rows and a plurality of columns;

performing a second etch into the first conductive layer through the through holes to form a plurality of lateral recesses respectively in the through holes;

forming a data storage layer in the lateral recesses;

forming a first channel layer and a plurality of first gate pillar structures respectively in the through holes;

performing a third etch into the first stack to form a plurality of trenches, wherein the trenches extend in parallel with the rows and separate the rows from each other;

performing a fourth etch into the sacrificial layer through the trenches to remove individual segments of the sacrificial layer respectively at the rows and to form cavities respectively in place of the individual segments; and forming a second conductive layer filling the cavities.

17. The method of claim 16, wherein the data storage layer comprises a variable resistance material.

18. The method of claim 16, wherein the forming of the second conductive layer comprises:

depositing the second conductive layer filling the trenches and the cavities; and performing a fifth etch clearing the second conductive layer from the trenches while the second conductive layer persists at the cavities.

19. The method of claim 16, wherein the forming of the data storage layer comprises:

depositing the data storage layer lining the through holes and the lateral recesses; and performing a fifth etch to localize the data storage layer to the lateral recesses.

20. The method of claim 16, further comprising:

forming a plurality of conductive lines individual to the columns and extending in parallel respectively along the individual columns, wherein each of the conductive lines is electrically shorted to first gate pillar structures in the individual column.

* * * * *